US011644729B2

(12) United States Patent
Nishimura et al.

(10) Patent No.: US 11,644,729 B2
(45) Date of Patent: May 9, 2023

(54) ACTIVE MATRIX SUBSTRATE AND LIQUID CRYSTAL DISPLAY DEVICE

(71) Applicant: Sharp Display Technology Corporation, Kameyama (JP)

(72) Inventors: Jun Nishimura, Kameyama (JP); Akira Tagawa, Kameyama (JP); Yasuaki Iwase, Kameyama (JP); Yohei Takeuchi, Kameyama (JP)

(73) Assignee: SHARP DISPLAY TECHNOLOGY CORPORATION, Kameyama (JP)

( * ) Notice: Subject to any disclaimer, the term of this patent is extended or adjusted under 35 U.S.C. 154(b) by 0 days.

(21) Appl. No.: 17/743,517

(22) Filed: May 13, 2022

(65) Prior Publication Data

US 2022/0373832 A1 Nov. 24, 2022

(30) Foreign Application Priority Data

May 20, 2021 (JP) .............................. JP2021-085393

(51) Int. Cl.
*G02F 1/1368* (2006.01)
*G02F 1/1362* (2006.01)
*G02F 1/1343* (2006.01)

(52) U.S. Cl.
CPC ...... *G02F 1/1368* (2013.01); *G02F 1/134336* (2013.01); *G02F 1/136227* (2013.01); *G02F 1/136286* (2013.01); *G02F 2202/10* (2013.01)

(58) Field of Classification Search
CPC ............. G02F 1/1368; G02F 1/134336; G02F 1/136227; G02F 1/136286; G02F 2202/10
See application file for complete search history.

(56) References Cited

U.S. PATENT DOCUMENTS

| | | | |
|---|---|---|---|
| 6,552,706 B1 | 4/2003 | Ikeda et al. | |
| 2012/0138922 A1 | 6/2012 | Yamazaki et al. | |
| 2012/0320026 A1 | 12/2012 | Kitayama et al. | |
| 2013/0320334 A1 | 12/2013 | Yamazaki et al. | |
| 2014/0176845 A1* | 6/2014 | Uchida | G02F 1/136227 438/30 |

(Continued)

FOREIGN PATENT DOCUMENTS

| | | |
|---|---|---|
| JP | 2001-033757 A | 2/2001 |
| JP | 2012-134475 A | 7/2012 |

(Continued)

*Primary Examiner* — Edward J Glick
*Assistant Examiner* — David Y Chung
(74) *Attorney, Agent, or Firm* — Keating & Bennett, LLP

(57) ABSTRACT

An active matrix substrate includes a first pixel region defined by first and second source bus lines adjacent to each other and first and second gate bus lines adjacent to each other and further includes a first pixel electrode and a first oxide semiconductor TFT that are associated with the first pixel region. The first oxide semiconductor TFT includes an oxide semiconductor layer and a gate electrode electrically connected to the first gate bus line. The oxide semiconductor layer includes a channel region and a low-resistance region including first and second regions located on opposite sides of the channel region. When viewed in a direction normal to the substrate, the low-resistance region extends across the first source bus line to another pixel region and partially overlaps a pixel electrode disposed in the other pixel region with an insulating layer interposed therebetween.

19 Claims, 16 Drawing Sheets

(56) References Cited

U.S. PATENT DOCUMENTS

| | | | |
|---|---|---|---|
| 2014/0286076 A1 | 9/2014 | Aoki et al. | |
| 2015/0287742 A1* | 10/2015 | Yamashita | H01L 27/1255 |
| | | | 438/104 |
| 2018/0350994 A1 | 12/2018 | Hosaka et al. | |
| 2019/0311688 A1 | 10/2019 | Kitagawa et al. | |

FOREIGN PATENT DOCUMENTS

| | | | |
|---|---|---|---|
| JP | 2014-007399 A | 1/2014 | |
| JP | 2014-209727 A | 11/2014 | |
| JP | 2019-184725 A | 10/2019 | |
| WO | 2011/093374 A1 | 8/2011 | |
| WO | 2017/085591 A1 | 5/2017 | |

\* cited by examiner

ACTIVE MATRIX SUBSTRATE AND LIQUID CRYSTAL DISPLAY DEVICE

BACKGROUND

1. Field

The present disclosure relates to an active matrix substrate and a liquid crystal display device.

2. Description of the Related Art

An active matrix substrate used for a display device such as a liquid crystal display device includes thin film transistors (hereinafter referred to as TFTs) serving as switching elements provided for respective pixels. It has been proposed to use, as the material of an active layer of TFTs, an oxide semiconductor instead of amorphous silicon and polycrystalline silicon. These TFTs are referred to as "oxide semiconductor TFTs". Most of the oxide semiconductor TFTs are bottom gate TFTs, but top gate oxide semiconductor TFTs have been proposed (for example, International Publication No. WO2017/085591).

Mobility in oxide semiconductors is higher than that in amorphous silicon. Therefore, oxide semiconductor TFTs can operate at a higher speed than amorphous silicon TFTs. Moreover, oxide semiconductor films are produced by a simpler process than polycrystalline silicon films and are therefore applicable to devices that have large areas.

Moreover, oxide semiconductor TFTs have good off-leakage characteristics. Therefore, when such oxide semiconductor TFTs are used as pixel TFTs, an operating mode in which images are displayed with a reduced image rewrite frequency can be used. Specifically, in this operating mode, drive periods and pause periods are provided. In the drive periods, scanning lines (gate bus lines) are scanned to write signal voltages. In the pause periods, all the scanning lines are not scanned, and writing is paused. This driving method is called pause driving or low-frequency driving and allows the power consumption of the liquid crystal display device to be largely reduced (see Japanese Unexamined Patent Application Publication No. 2019-184725).

In a display device using an active matrix substrate, parasitic capacitance causes fluctuations in pixel potential, and this may lead to a reduction in display quality. This problem is particularly recognizable when low-frequency driving is performed. It is known that, when the low-frequency driving is performed, blinking called flicker caused by fluctuations in pixel potential due to parasitic capacitance is more likely to occur on the display during a pause period in the low-frequency driving.

It is desirable to provide an active matrix substrate including pixels provided with respective oxide semiconductor TFTs and capable of reducing deterioration in display quality and to provide a liquid crystal display device using the active matrix substrate.

SUMMARY

According to an aspect of the disclosure, there is provided an active matrix substrate including:

a substrate having a plurality of pixel regions arranged in a row direction and a column direction in a matrix form;

a plurality of gate bus lines supported on a principal surface of the substrate and extending in the row direction;

a plurality of source bus lines supported on the principal surface of the substrate and extending in the column direction;

a plurality of oxide semiconductor TFTs each disposed so as to be associated with a corresponding one of the plurality of pixel regions;

a plurality of pixel electrodes each disposed in a corresponding one of the plurality of pixel regions; and an insulating layer, wherein the plurality of gate bus lines include a first gate bus line and a second gate bus line that are disposed adjacent to each other, wherein the plurality of source bus lines include a first source bus line and a second source bus line that are disposed adjacent to each other, wherein the plurality of pixel regions include a first pixel region defined by the first source bus line, the second source bus line, the first gate bus line, and the second gate bus line, wherein the plurality of pixel electrodes include a first pixel electrode disposed in the first pixel region, wherein the plurality of oxide semiconductor TFTs include a first oxide semiconductor TFT associated with the first pixel region, wherein the first oxide semiconductor TFT includes an oxide semiconductor layer including a channel region and a low-resistance region having a lower specific resistance than the channel region, the low-resistance region including a first region and a second region that are located on opposite sides of the channel region, the first region being electrically connected to the first source bus line, the second region being electrically connected to the first pixel electrode and a gate electrode electrically connected to the first gate bus line, wherein, when viewed in a direction normal to the substrate, the low-resistance region of the oxide semiconductor layer in the first oxide semiconductor TFT extends across the first source bus line to another pixel region of the plurality of pixel regions and partially overlaps another pixel electrode of the plurality of pixel electrodes that is disposed in the another pixel region with the insulating layer interposed between the low-resistance region and the another pixel electrode.

According to another aspect of the disclosure, there is provided an active matrix substrate including:

a substrate having a plurality of pixel regions;

an insulating layer;

a plurality of gate bus lines supported on a principal surface of the substrate; and a plurality of source bus lines supported on the principal surface of the substrate, the plurality of source bus lines including a first source bus line and a second source bus line that are disposed adjacent to each other, wherein each of the plurality of pixel regions includes a pixel electrode, an oxide semiconductor TFT electrically connected to the pixel electrode, a dielectric layer, and a common electrode that partially overlaps the pixel electrode with the dielectric layer interposed therebetween, wherein the oxide semiconductor TFT of each pixel region includes an oxide semiconductor layer including a channel region and a low-resistance region having a lower specific resistance than the channel region, the low-resistance region including a first region and a second region that are located on opposite sides of the channel region, the first region being electrically connected to one of the plurality of source bus lines, the second region being electrically connected to the pixel electrode of the each pixel region and a gate electrode electrically connected to one of the plurality of gate bus lines, wherein the plurality of pixel regions include a first pixel region, a second pixel region, and a third pixel region, wherein the pixel electrode of the first pixel region and the pixel electrode of the second pixel region are electrically connected to the first source bus line through the respective oxide semiconductor TFTs, wherein the pixel electrode of the third pixel region is electrically connected to the second source bus line different from the first source bus line through the oxide semiconductor TFT of the third pixel region, and wherein the pixel electrode of the first pixel region includes a first portion that overlaps the low-resistance region of the oxide semiconductor TFT of the second pixel region with the insulating layer interposed therebetween and a second portion that overlaps the low-resistance region of the oxide semiconductor TFT of the third pixel region with the insulating layer interposed therebetween.

According to another aspect of the disclosure, there is provided an active matrix substrate including:

a substrate having a plurality of pixel regions arranged in a row direction and a column direction in a matrix form;

a plurality of gate bus lines supported on a principal surface of the substrate and extending in the row direction;

a plurality of source bus lines supported on the principal surface of the substrate and extending in the column direction;

a plurality of oxide semiconductor TFTs each disposed so as to be associated with a corresponding one of the plurality of pixel regions;

a plurality of pixel electrodes each disposed in a corresponding one of the plurality of pixel regions; and an insulating layer, wherein the plurality of gate bus lines include a first gate bus line and a second gate bus line that are disposed adjacent to each other, wherein the plurality of source bus lines include a first source bus line and a second source bus line that are disposed adjacent to each other, wherein the plurality of pixel regions include a first pixel region defined by the first source bus line, the second source bus line, the first gate bus line, and the second gate bus line, wherein the plurality of pixel electrodes include a first pixel electrode disposed in the first pixel region, wherein the plurality of oxide semiconductor TFTs include a first oxide semiconductor TFT associated with the first pixel region, wherein the first oxide semiconductor TFT includes an oxide semiconductor layer including a channel region and further including a first region and a second region that are located on opposite sides of the channel region, the first region being electrically connected to the first source bus line, the second region being electrically connected to the first pixel electrode and a gate electrode electrically connected to the first gate bus line, and wherein the first pixel electrode has a portion that overlaps at least one of the first source bus line and the second source bus line with the insulating layer interposed therebetween.

DESCRIPTION OF THE EMBODIMENTS

As described above, when low-frequency driving is performed on a liquid crystal display device, fluctuations in potentials of pixel electrodes (pixel potentials) may occur due to parasitic capacitance Csd when fluctuations in potentials of source bus lines occur during a pause period. This may cause changes in brightness of pixels, and a phenomenon called flicker may occur.

The parasitic capacitance Csd includes: parasitic capacitance Csd(A) formed between an pixel electrode of a pixel (a pixel of interest) and a source bus line that supplies a data signal to the pixel electrode (this source bus line is referred to as a "source bus line for the pixel of interest"); and parasitic capacitance Csd(B) formed between the pixel electrode of the pixel of interest and a source bus line that supplies a data signal to an pixel electrode adjacent to the above pixel electrode (this source bus line is referred to as another source bus line). In the present specification, the parasitic capacitance Csd(A) is referred to as "own source parasitic capacitance", and the parasitic capacitance Csd(B) is referred to as "other source parasitic capacitance".

The change in the brightness of a pixel due to the parasitic capacitance Csd (the occurrence of flicker) can be reduced by reducing the absolute value of β(A−B) (hereinafter referred to as "β value") represented by formula (1) below. For example, when the β value is substantially 0, the change in the brightness of the pixel due to the fluctuations in the potentials of the source bus lines can be minimized. Even when the low-frequency driving is not performed, a reduction in the display quality caused by the parasitic capacitance Csd can be avoided by reducing the β value.

$$\beta(A-B)=\{Csd(A)-Csd(B)\}/Cpi \quad (1)$$

Figure 13:
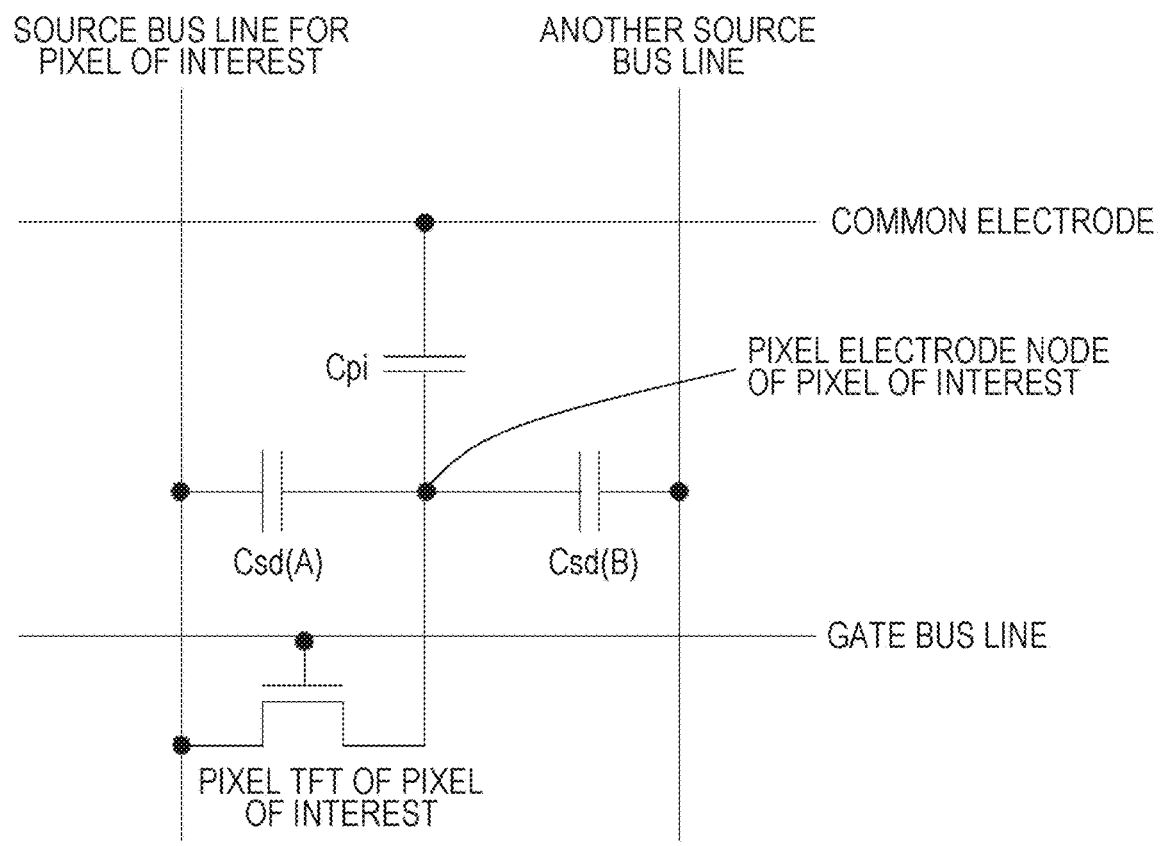
FIG. 13 is a circuit diagram showing, for example, parasitic capacitances Csd(A) and Csd(B) and pixel capacitance Cpi in an pixel region (a pixel of interest).

Csd(A): own source parasitic capacitance
Csd(B): other source parasitic capacitance
Cpi: pixel capacitance The pixel capacitance Cpi in formula (1) includes liquid crystal capacitance formed by the pixel electrode of the pixel of interest and a common electrode and auxiliary capacitance. For example, in an active matrix substrate applied to a transverse electric field mode display device, the auxiliary capacitance includes, for example, transparent auxiliary capacitance formed between the pixel electrode of the pixel of interest and the common electrode. FIG. 13 shows, for example, the Csd(A), Csd(B), and Cpi in a pixel (a pixel of interest).

To decrease the reduction in display quality and the occurrence of flicker in relation to formula (1) above, for example, it is contemplated that the physical properties of the materials of components, processes, a driving method, and so on of the liquid crystal display device are controlled such that the difference ΔCsd (absolute value) between the own source parasitic capacitance Csd(A) and the other source parasitic capacitance Csd(B) is reduced (for example, Japanese Unexamined Patent Application Publication No. 2019-184725).

However, there are a variety of requests for the performance of liquid crystal display devices in addition to the reduction in flicker. It is therefore difficult to select the physical properties of materials, processes, and a driving method that allow the requests to be satisfied simultaneously. Moreover, as the resolution of a liquid crystal display device increases, the Cpi decreases. As can be seen from formula (1) above, as the Cpi decreases, the β value increases. Therefore, by controlling only the materials and the driving method, the occurrence of flicker may not be reduced sufficiently.

Accordingly, the present inventors have conducted studies on a method capable of reducing the β value using an approach different from methods according to the related art. The inventors have found a novel structure that allows the β value, particularly ΔCsd, to be reduced using the layout of pixels and thus arrived at the present disclosure.

Generally, in an active matrix substrate of a liquid crystal display device, parasitic capacitances due to oblique electric fields may be formed between each pixel electrode and a source bus line for the pixel of interest that is located on one side of the pixel electrode and between the pixel electrode and another source bus line located on the other side. These parasitic capacitances due to the oblique electric fields (these parasitic capacitances are hereinafter referred to as "normal parasitic capacitances") are included in the parasitic capacitance Csd(A) and the parasitic capacitance Csd(B). In some active matrix substrate structures, the normal parasitic capacitances can be very small (when, for example, the common electrode is present on the substrate side of the pixel electrodes). In one embodiment of the present disclosure, an oxide semiconductor layer that is used as an active layer of each oxide semiconductor TFT is utilized to form other parasitic capacitances (hereinafter referred to as "additional parasitic capacitances"). The additional parasitic capacitances are formed, for example, by extending a low-resistance region of the oxide semiconductor layer so as to partially overlap the pixel electrodes of adjacent pixels when the active matrix substrate is viewed in a direction normal to the substrate. In the present specification, the parasitic capacitances formed using the oxide semiconductor layer are referred to as the "additional parasitic capacitances", and the parasitic capacitances due to oblique electric fields that are formed also in a structure according to the related art are referred to as the "normal parasitic capacitances" to distinguish them from each other.

In one embodiment of the present disclosure, by forming the additional parasitic capacitances, one or both of the own source parasitic capacitance Csd(A) and the other source parasitic capacitance Csd(B) are increased by a prescribed amount. In this manner, the difference ΔCsd between the own source parasitic capacitance Csd(A) and the other source parasitic capacitance Csd(B) can be controlled.

It is generally known that the smaller the parasitic capacitance Csd, the better. In contrast to the knowledge according to the related art, in the present embodiment, the additional parasitic capacitances are intentionally formed to thereby increase the parasitic capacitance Csd(A) and/or the parasitic capacitance Csd(B) as needed. In this manner, the parasitic capacitance Csd does not increase largely, and the difference ΔCsd between the own source parasitic capacitance Csd(A) and the other source parasitic capacitance Csd(B) can be reduced to a low level, so that the occurrence of flicker can be reduced.

The additional parasitic capacitances can be controlled, for example, by changing the overlapping areas between the oxide semiconductor layer of a pixel TFT and the pixel electrodes of adjacent pixels. Therefore, the β value can be improved by changing the layout of the pixels irrespective of the materials and the driving method. Moreover, the additional parasitic capacitances are formed from an oxide semiconductor film and a transparent conductive film. Therefore, the formation of the additional parasitic capacitances does not cause a reduction in the aperture ratio of pixels.

First Embodiment

An active matrix substrate in a first embodiment will be described with reference to the drawings.

Figure 1:
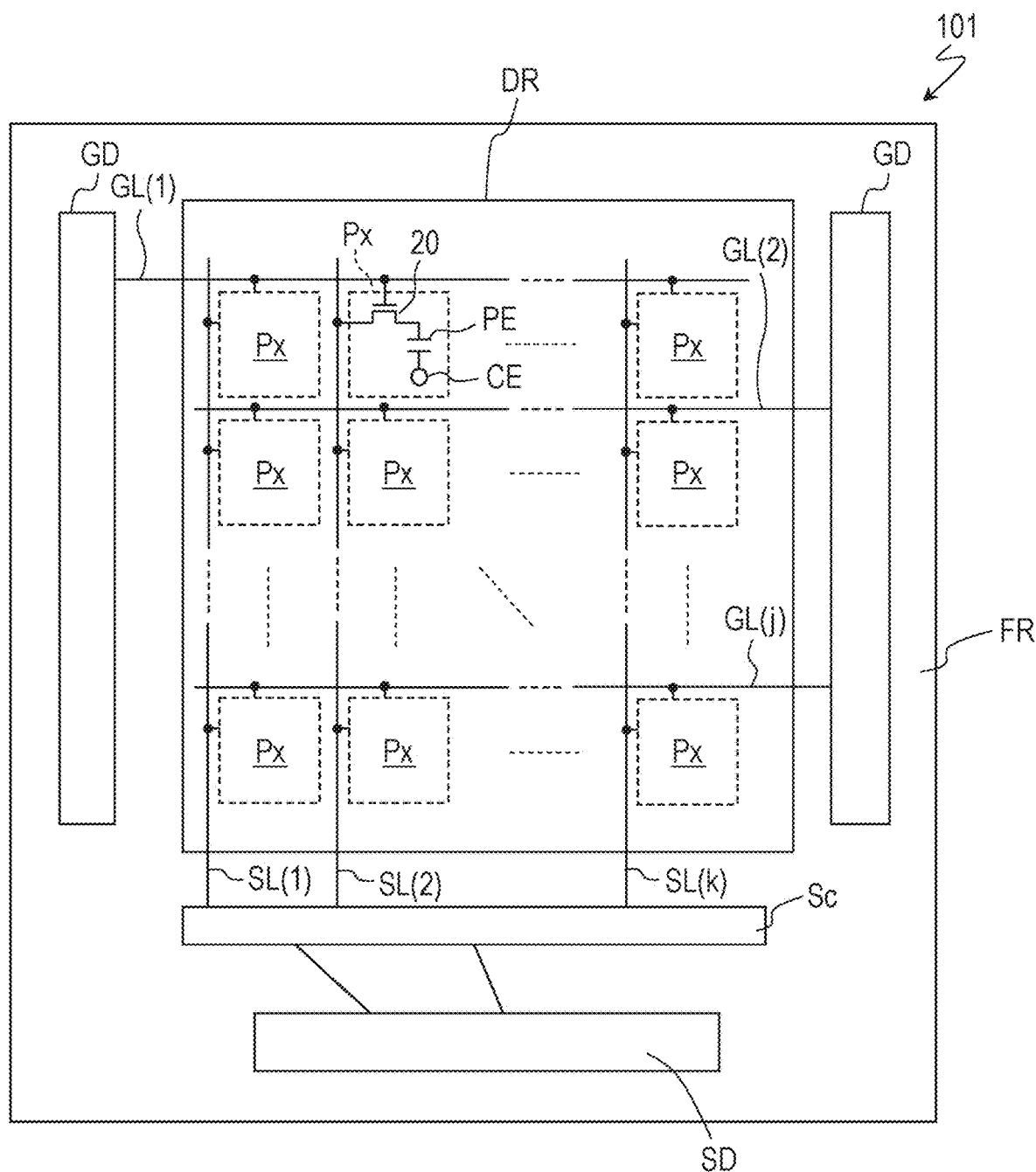
FIG. 1 is a schematic illustration showing an example of a plane structure of an active matrix substrate.

FIG. 1 is a schematic illustration showing an example of a plane structure of an active matrix substrate 101. The active matrix substrate 101 has a display region DR that contributes to display and a peripheral region (picture-frame region) FR located outside the display region DR. The display region DR includes a plurality of pixel regions Px arranged in row and column directions in a matrix form. The pixel regions Px (which may be referred to simply as "pixels") are regions corresponding to pixels of a display device. The non-display region FR is located on the periphery of the display region DR and does not contribute to display.

The active matrix substrate 101 includes, in the display region DR, a substrate 1, a plurality of TFTs (which may be referred to also as "pixel TFTs") 20 supported on the substrate 1, a plurality of pixel electrodes PE, a plurality of gate bus lines GL(1) to GL(j) (j is an integer of 2 or more, and these are referred to collectively as "gate bus lines GL") that supply gate signals to the TFTs 20, and a plurality of source bus lines SL(1) to SL(k) (k is an integer of 2 or more, and these are referred to collectively as "source bus lines SL") that supply source signals to the TFTs 20. The pixel regions Px are defined, for example, by the gate bus lines GL and the source bus lines SL. In the present specification, the direction in which the source bus lines SL extend is defined as a "column direction", and the direction in which the gate bus lines GL extend is defined as a "row direction". The row direction may be any direction that intersects the column direction and is not necessarily perpendicular to the column direction. In the present specification, a column including a plurality of pixel regions arranged between two adjacent source bus lines SL may be referred to as a "pixel column", and a row including a plurality of pixel regions arranged between two adjacent gate bus lines GL may be referred to as a "pixel row".

Each of the TFTs 20 and each of the pixel electrodes PE are disposed so as to be associated with a corresponding one of the plurality of pixel regions Px. The gate electrode of each TFT 20 is electrically connected to a corresponding one of the gate bus lines GL, and the source electrode of each TFT 20 is electrically connected to a corresponding one of the source bus lines SL. The drain electrode of each TFT 20 is electrically connected to the corresponding pixel electrode PE. In the present embodiment, the TFTs 20 are, for example, a plurality of oxide semiconductor TFTs having a top gate structure.

When the active matrix substrate 101 is applied to a transverse electric field mode display device such as an FFS (Fringe Field Switching) mode display device, an electrode (common electrode) CE common to the plurality of pixel regions Px is disposed in the active matrix substrate 101.

Peripheral circuits such as drivers may be disposed in the non-display region FR. For example, a gate driver GD that drives the gate bus lines GL and an SSD circuit Sc that drives the source bus lines SL in a time-sharing manner may be formed monolithically. For example, the SSD circuit Sc is connected to a source driver SD mounted by a COG (Chip on Glass) method.

A display panel using the active matrix substrate 101 includes, for example, the active matrix substrate 101, a counter substrate, and a display medium layer disposed therebetween. The display medium layer may be a liquid crystal layer or an organic EL layer.

In the display panel using the active matrix substrate 101, line sequential scanning is performed. In the line sequential scanning method, data signals (referred to also as display signals) are supplied to the pixel electrodes PE. Specifically, when a TFT 20 selected by a control signal supplied to a gate bus line GL from the gate driver GD is switched on, a data signal is supplied to a source bus line SL connected to the selected TFT 20. Therefore, TFTs 20 connected to a specific gate bus line GL are switched on simultaneously, and then data signals are supplied from the source bus lines SL connected to the TFTs 20 in the pixel regions Px in the selected row. This operation is sequentially repeated, for example, from the uppermost pixel row in the display surface to the lowermost pixel row, and one image (frame) is thereby written and displayed in the display region DR. The time from when one pixel row is selected to when the next row is selected is referred to as a horizontal scanning period (1H), and the time from when one row is selected to when the row is again selected is referred to as a vertical scanning period (1V) or a frame.

The display panel is generally AC-driven. Typically, frame-reversal driving is performed in which the polarity of the display signals is inverted every frame (every vertical scanning period). For example, the polarity is inverted every 1/60 sec (the cycle of polarity inversion is 30 Hz). To uniformly distribute pixels with voltages with different polarities applied thereto within one frame, dot inversion driving, column inversion driving (source line inversion) driving, etc. is performed. The dot inversion driving is a driving method in which opposite polarities are applied to pixels adjacent in the vertical or horizontal direction and the polarities of the data signals are inverted every frame. The column inversion driving is a driving method in which the polarities of the pixel voltages are inverted every frame and every prescribed number of source bus lines. In another known driving method used for a display panel configured such that the positional relation between pixels and source bus lines SL corresponding to these pixels in a pixel row differs from that in another pixel row, the polarities of the source bus lines SL are inverted every frame (this driving method is referred to as a Z inversion method). This method is disclosed in, for example, Japanese Unexamined Patent Application Publication No. 2001-33757 and International Publication No. WO2011/093374. The entire contents of the disclosures of Japanese Unexamined Patent Application Publication No. 2001-33757 and International Publication No. WO2011/093374 are incorporated by reference for reference purposes.

In a display panel to which a driving method such as column inversion driving, Z inversion driving, or dot inversion driving is applied, data signals with first polarity (hereinafter referred to as "first data signals") are supplied to some of the plurality of source bus lines SL, and data signals with second polarity opposite to the first polarity (hereinafter referred to as "second data signals") are supplied to the rest of the source bus lines SL. The polarities of the first and second data signals are inverted every frame. In the present specification, source bus lines SL to which the first data signals are supplied are referred to as "first polarity source bus lines", and bus lines SL to which the second data signals are supplied are referred to as "second polarity source bus lines". For example, sets of Z first polarity source bus lines and sets of Z second polarity source bus lines are arranged alternately (where Z is an integer of 1 or more, for example, Z=1).

<Structure of Pixel Regions of Active Matrix Substrate 101>

Next, the structure of the pixel regions of the active matrix substrate 101 in the present embodiment will be described with reference to the drawings using an active matrix substrate applied to an FFS mode display device as an example. The FFS mode is a transverse electric field mode in which a pair of electrodes are disposed in one substrate to apply an electric field to liquid crystal molecules in a direction parallel to the surface of the substrate (transverse direction).

Figure 2A:
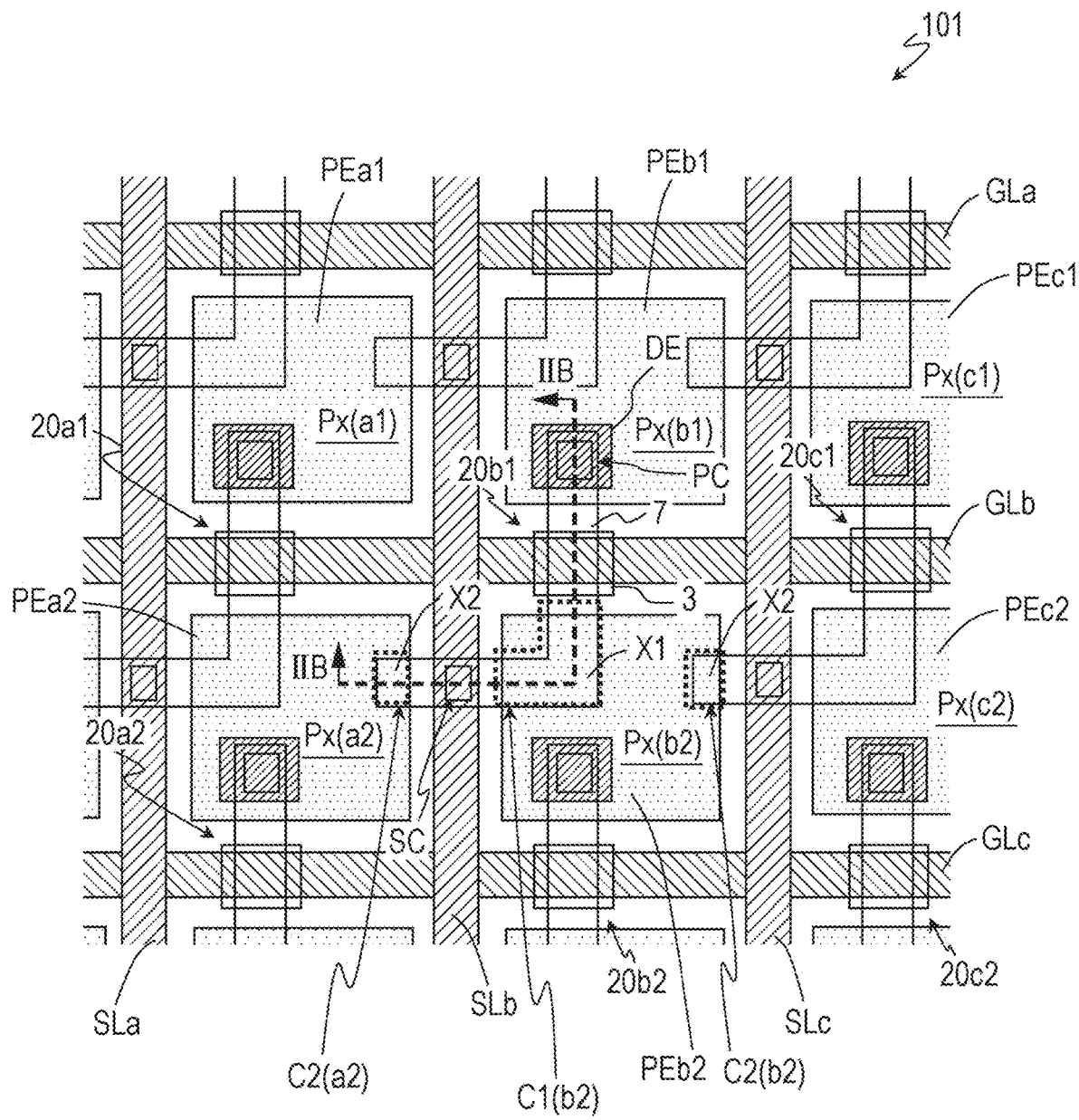
FIG. 2A is a plan view showing some pixel regions in the active matrix substrate.
Figure 2B:
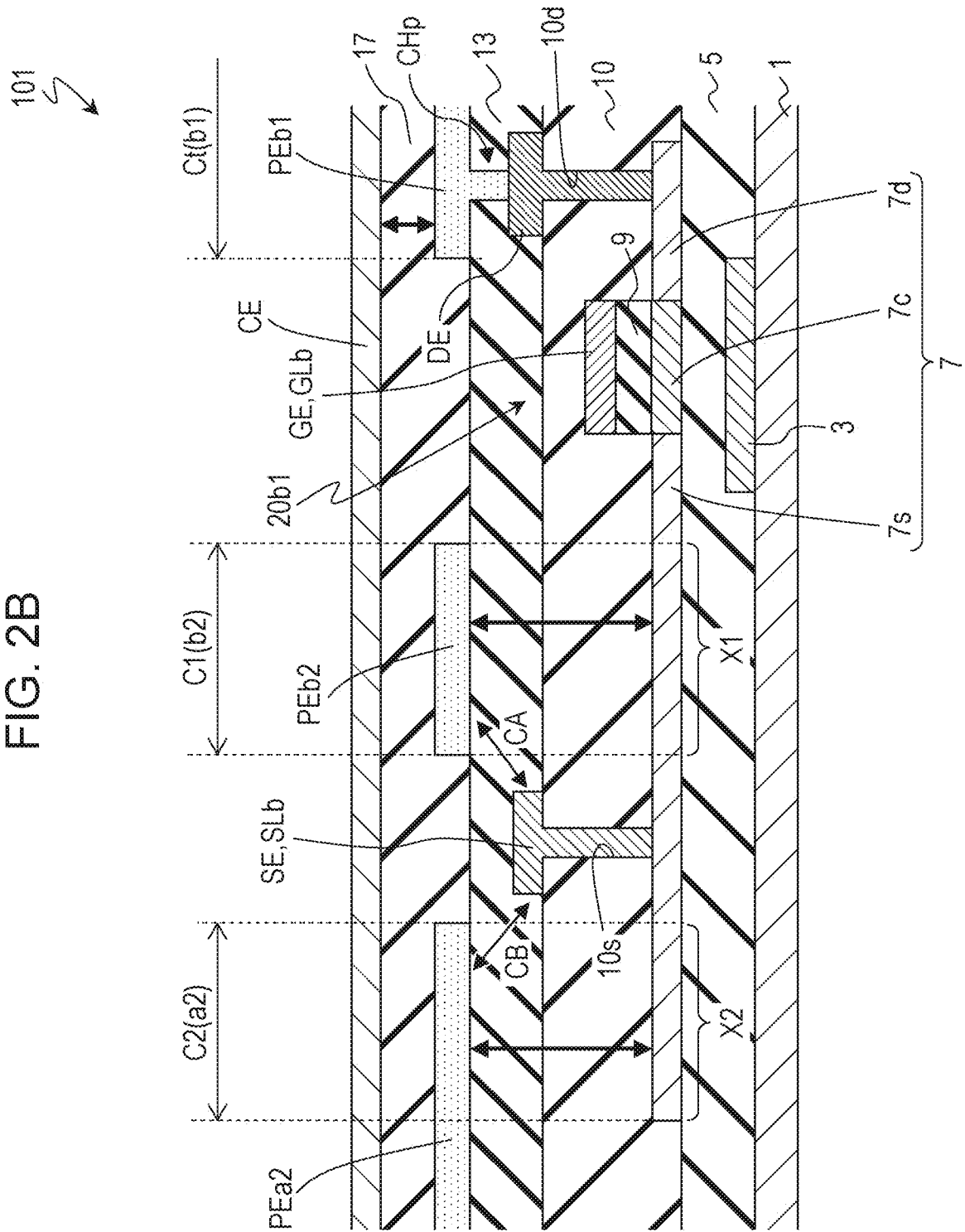
FIG. 2B is a sectional view taken along line IIB-IIB in FIG. 2A.

FIG. 2A is a plan view showing, for example, some pixel regions Px in the active matrix substrate 101. FIG. 2B is a sectional view taken along line IIB-IIB in FIG. 2A.

The active matrix substrate 101 includes a substrate 1 and further includes a plurality of source bus lines SL and a plurality of gate bus lines GL that are supported on the substrate 1. The source bus lines SL extend in the column direction, and the gate bus lines GL extend in the row direction. In this example, each of the pixel regions Px is defined by two adjacent source bus lines SL and two adjacent gate bus lines GL.

FIG. 2A shows gate bus lines GLa, GLb, and GLc among the plurality of gate bus lines GL that are arranged in this order from the top of the figure and source bus lines SLa, SLb, and SLc among the plurality of source bus lines SL that are arranged in this order from the left side of the figure. Six pixel regions Px(a1) to Px(c2) defined by these bus lines are also shown. The pixel regions Px(a1), Px(b1), and Px(c1) are disposed between the gate bus lines GLa and GLb and arranged in the row direction from the left side of the figure. The pixel regions Px(a2), Px(b2), and Px(c2) are disposed between the gate bus line GLb and GLc and arranged in the row direction from the left side of the figure. The pixel regions Px(a2), Px(b2), and Px(c2) are adjacent to the pixel regions Px(a1), Px(b1), and Px(c1), respectively, in the column direction.

Each of the pixel regions Px has a pixel electrode PE and a TFT 20. In this example, the pixel region Px(a1) has a pixel electrode PEa1 and a TFT 20a1. The pixel electrode PEa1 is disposed within the pixel region Px. The TFT 20a1 is disposed so as to be associated with the pixel region Px(a1), and part of the TFT 20a1 extends to other pixel regions. Similarly, the pixel regions Px(a2), Px(b1), Px(b2), Px(c1), and Px(c2) have pixel electrodes PEa2, PEb1, PEb2, PEc1, and PEc2, respectively, disposed therein and TFTs 20a2, 20b1, 20b2, 20c1, and 20c2, respectively, disposed so as to be associated with the respective pixel regions.

In the present embodiment, pixel electrodes PE disposed in the same pixel column are electrically connected to the same source bus line SL through the respective TFTs 20. In this example, the pixel electrodes PEa1 and PEa2 are connected to the source bus line SLa through the TFTs 20a1 and 20a2, respectively. Similarly, the pixel electrodes PEb1 and PEb2 are connected to the source bus line SLb through the TFT 20b1 and 20b2, respectively, and the pixel electrodes PEc1 and PEc2 are connected to the source bus line SLc through the TFTs 20c1 and 20c2, respectively.

Referring next to FIGS. 2A and 2B, the structure of the pixel regions Px and the TFTs 20 will be described more specifically using as an example the pixel region Px(b1) defined by the source bus lines SLb and SLc and the gate bus lines GLa and GLb.

The pixel region Px(b1) includes the substrate 1, the TFT 20b1 supported on the substrate 1, the pixel electrode PEb1, and a common electrode CE. The TFT 20b1 is disposed so as to be associated with the pixel region Px(b1). Part of the TFT 20b1 is located in other pixel regions (the pixel regions Px(b2) and Px(a2) in this example).

As shown in FIG. 2B, the TFT 20b1 includes an oxide semiconductor layer 7 and a gate electrode GE disposed on part of the oxide semiconductor layer 7 with a gate insulating layer 9 interposed therebetween. The TFT 20b1 may further include a source electrode SE and a drain electrode DE.

The oxide semiconductor layer 7 includes a channel region 7c and further includes a first region 7s and a second region 7d disposed on opposite sides of the channel region 7c. The first region 7s and the second region 7d are low-resistance regions having a smaller specific resistance than the channel region 7c. The first region 7s is electrically connected to the corresponding source bus line SLb, and the second region 7d is electrically connected to the pixel electrode PEb1. In this example, the first region 7s is connected to the source electrode SE and electrically connected to the source bus line SLb through the source electrode SE. The second region 7d is connected to the drain electrode DE and electrically connected to the pixel electrode PEb1 through the drain electrode DE.

The gate electrode GE is disposed so as to overlap the channel region 7c when viewed in the direction normal to the principal surface of the substrate 1 (hereinafter abbreviated as the "direction normal to the substrate 1"). The gate electrode GE is formed using the same conductive film (gate conductive film) as that for the gate bus lines GL. In the present specification, a layer including electrodes and wiring lines formed using the gate conductive film is referred to as a "gate metal layer". The gate electrode GE is electrically connected to the corresponding gate bus line GLb. The gate electrode GE may be formed integrally with the corresponding gate bus line GL. For example, the gate electrode GE may be connected to the corresponding gate bus line GL or may be part thereof. In this case, part of the gate bus line GL that overlaps the oxide semiconductor layer 7 when the gate bus line GL is viewed in the direction normal to the substrate 1 is referred to as the "gate electrode GE". When viewed in the direction normal to the substrate 1, the gate electrode GE overlaps the channel region 7c but may be disposed so as not to overlap the low-resistance regions (the first region 7s and the second region 7d).

The gate insulating layer 9 may cover the channel region 7c and may not cover the first region 7s and the second region 7d. The above structure can be obtained by subjecting portions of the oxide semiconductor layer 7 that are not covered with the gate insulating layer 9 to resistance reduction. In the example illustrated, the gate insulating layer 9 is formed only in a region that overlap the gate metal layer when viewed in the direction normal to the substrate 1. Specifically, the edges of the gate insulating layer 9 match the edges of the gate metal layer. This structure can be obtained by patterning the gate insulating layer using the same resist mask as that used to pattern the gate metal layer or using the gate electrode GE as a mask.

In the present embodiment, the oxide semiconductor layer 7, the gate insulating layer 9, and the gate metal layer are covered with an interlayer insulating layer 10, and the source electrode SE and the drain electrode DE are disposed on the interlayer insulating layer 10. The interlayer insulating layer 10 may be in contact with the first region 7s and the second region 7d of the oxide semiconductor layer 7. A first opening 10s through which part of the first region 7s of the oxide semiconductor layer 7 is exposed and a second opening 10d through which part of the second region 7d is exposed are provided in the interlayer insulating layer 10. The source electrode SE is disposed on the interlayer insulating layer 10 and in the first opening 10s and connected to the first region 7s within the first opening 10s. The drain electrode DE is disposed on the interlayer insulating layer 10 and in the second opening 10d and connected to the second region 7d within the second opening 10d.

The source electrode SE and the drain electrode DE may be formed using the same conductive film (source conductive film) as that used for the source bus lines SL. In the present specification, a layer including electrodes and wiring lines formed using the source conductive film is referred to as a "source metal layer". The source electrode SE is electrically connected to the corresponding source bus line SLb. The source electrode SE may be formed integrally with the corresponding source bus line SL. For example, the source electrode SE may be connected to the corresponding source bus line SL or may be part thereof. In this case, part of the source bus line SL that is in contact with the first region 7s is referred to as the "source electrode SE". In the present specification, the connection portion SC between the first region 7s of the oxide semiconductor layer 7 and the source bus line SL may be referred to as a "source contact portion". In the example illustrated, the source contact portion SC is disposed so as to overlap the source bus line SL.

The drain electrode DE is electrically connected to the corresponding pixel electrode PEb1. In the present specification, the connection portion PC between the second region 7d of the TFT 20 and the pixel electrode PE may be referred to as a "pixel contact portion". The pixel contact portion PC is disposed, for example, in the pixel region Px(b1). The drain electrode DE may not be disposed in the source metal layer, and the pixel electrode PEb1 may be brought into direct contact with part of the second region 7d within the pixel contact portion.

In the present embodiment, when viewed in the direction normal to the substrate 1, the first region 7s of the oxide semiconductor layer 7 in each TFT 20 includes: a portion X1 that overlaps the pixel electrode PE of a pixel region Px adjacent in the column direction; and a portion X2 that overlaps the pixel electrode PE of a pixel region Px in an adjacent pixel column (a pixel region adjacent in the row direction or an oblique direction). Additional parasitic capacitances C1 and C2 are thereby formed.

In the example illustrated, the first region 7s of the oxide semiconductor layer 7 in the TFT 20b1 of the pixel region Px(b1) includes: the portion X1 that overlaps the pixel electrode PEb2 of the pixel region Px(b2) adjacent in the column direction; and the portion X2 that overlaps the pixel electrode PEa2 of the pixel region Px(a2) adjacent in an oblique direction. The portion X1 of the oxide semiconductor layer 7, the pixel electrode PEb2, and insulating layers located therebetween (the interlayer insulating layer 10 and an upper insulating layer 13 in this case) form the additional parasitic capacitance C1(b2). Similarly, the portion X2 of the oxide semiconductor layer 7, the pixel electrode PEa2, and insulating layers located therebetween (the interlayer insulating layer 10 and the upper insulating layer 13 in this case) form the additional parasitic capacitance C2(a2). While the TFT 20b has been described as an example, the oxide semiconductor layer 7 in each of the TFTs 20 of the other pixel regions Px can similarly form additional parasitic capacitances C1 and C2 between the oxide semiconductor layer 7 and the pixel electrodes PE of pixel regions Px adjacent in the column direction and the oblique direction, respectively. Specifically, when attention is given to one pixel electrode PE, this pixel electrode PE forms additional parasitic capacitances C1 and C2 between itself and the oxide semiconductor layer 7 in the TFTs 20 of other pixel regions Px.

In the present embodiment, it is sufficient that the TFTs 20 be disposed such that the additional parasitic capacitances C1 and C2 can be formed. In the example shown in FIG. 2A, the channel length direction of the TFT 20b1 is substantially parallel to the column direction (the direction in which the source bus lines SL extend) (vertical TFT arrangement). In this example, when viewed in the direction normal to the substrate 1, the oxide semiconductor layer 7 in the TFT 20b1 extends from the pixel contact portion PC in the pixel region (the pixel of interest) Px(b1) across the gate bus line GLb, through the pixel region Px(b2) adjacent to the pixel of interest in the column direction, and across the source bus line SLb to the pixel region Px(a2) adjacent to the pixel of interest in an oblique direction. When the oxide semiconductor layer 7 is viewed in the direction normal to the substrate 1, a portion of the oxide semiconductor layer 7 that is located on the gate bus line GLb (or the gate electrode GE connected to the gate bus line GLb) is the channel region 7c. A region in the oxide semiconductor layer 7 that is located closer to the pixel contact portion PC than the channel region 7c is the second region 7d, and a region opposite to the second region 7d is the first region 7s. The first region 7s is electrically connected to the source bus line SLb at the source contact portion SC disposed on the source bus line SLb (or the source electrode SE connected to the source bus line SLb). When viewed in the direction normal to the substrate 1, the first region 7s of the oxide semiconductor layer 7 partially overlaps the pixel electrodes PEb2 and PEa2 of the pixel regions Px(b2) and Px(a2) adjacent in the column direction and the oblique direction, respectively.

The TFT 20b1 may include a conductive layer 3 located between the oxide semiconductor layer 7 and the substrate 1. The conductive layer 3 may be covered with a lower insulating layer 5, and the oxide semiconductor layer 7 may be disposed on the lower insulating layer 5. When viewed in the direction normal to the substrate 1, the conductive layer 3 may be disposed so as to overlap at least the channel region 7c of the oxide semiconductor layer 7. In this case, deterioration of the characteristics of the oxide semiconductor layer 7 due to light from the substrate 1 side (light from a backlight) can be reduced. The conductive layer 3 may be in an electrically floating state or may be fixed to, for example, the GND potential (0 V). Alternatively, the conductive layer 3 may be electrically connected to the gate electrode GE through a connection portion (not illustrated) so as to function as a lower gate electrode.

The upper insulating layer 13 is disposed on the source metal layer. The upper insulating layer 13 includes, for example, an inorganic insulating layer (passivation film). The upper insulating layer 13 may have a layered structure including the inorganic insulating layer and an organic insulating layer formed on the inorganic insulating layer. The organic insulating layer may not be formed. Alternatively, the organic insulating layer may be formed only in the display region.

The pixel electrode PEb1 is disposed on the upper insulating layer 13. The pixel electrode PEb1 is isolated from adjacent pixel electrodes PE. The pixel electrode PEb1 is electrically connected to the drain electrode DE of the TFT 20b1 within a pixel contact hole CHp formed in the upper insulating layer 13.

The common electrode CE is disposed on the pixel electrode PEb1 with a dielectric layer 17 interposed therebetween. Although not illustrated, one or a plurality of slits (openings) or cutout portions are provided in the common electrode CE at positions in each of the pixel regions Px. The common electrode CE may not be separated for each of the pixel regions Px. As shown in FIG. 2B, the common electrode CE partially overlaps each pixel electrode PE (the pixel electrode PEb1 in this case) with the dielectric layer 17 interposed therebetween, and auxiliary capacitance Ct (auxiliary capacitance Ct(b1) in this case) is thereby formed. The auxiliary capacitance Ct is formed from a transparent material and is therefore referred to also as transparent auxiliary capacitance.

<β Value>

As described above, in the present embodiment, the first region 7s of each TFT 20 that is a low-resistance region extends so as to overlap the pixel electrodes PE of other pixel regions Px when viewed in the direction normal to the substrate 1, and the additional parasitic capacitances (source-drain capacitances) C1 and C2 are thereby formed between the first region 7s and the pixel electrodes PE of the other pixel regions Px. Specifically, the first region 7s of the oxide semiconductor layer 7 functions also as a transparent capacitance electrode forming the parasitic capacitances. In this case, the magnitude of the own source parasitic capacitance and the magnitude of the other source parasitic capacitance can be controlled, and the β value described above can be reduced to a low level.

The own source parasitic capacitance Csd(A) and the other source parasitic capacitance Csd(B) for the pixel electrode PE of one pixel region (pixel of interest) will be described. In the following description, the pixel electrode PEb2 is used as an example.

The pixel electrode PEb2 of the pixel region Px(b2) forms normal parasitic capacitance CA(b2) between itself and a source bus line SLb for the pixel of interest due to an oblique electric field and forms normal parasitic capacitance CB(b2) between itself and another source bus line SLc due to an oblique electric field. Moreover, the pixel electrode PEb2 forms additional parasitic capacitance C1(b2) between itself and the portion X1 of the oxide semiconductor layer 7 in the TFT 20b1 of the pixel region Px(b1) adjacent in the column direction and forms additional parasitic capacitance C2(b2) between itself and the portion X2 of the oxide semiconductor layer 7 in the TFT 20c1 of the pixel region Px(c1) adjacent in the oblique direction. In this example, the additional parasitic capacitance C1(b2) is own source parasitic capacitance formed by the pixel electrode PEb2 that is the pixel of interest and the transparent electrode (the portion X1 of the TFT 20b1) connected to the source bus line SLb that is the source bus line for the pixel of interest, and is added to Csd(A) in formula (1) above. The additional parasitic capacitance C2(b2) is other source parasitic capacitance formed by the pixel electrode PEb2 and the transparent electrode (the portion X2 of the TFTs 20c1) connected to the source bus line SLc that is another source bus line, and is added to Csd(B) in formula (1). Let Csd(A), Csd(B), and $\Delta$Csd in the pixel region Px(b2) be $Csd(A)_{b2}$, $Csd(B)_{b2}$, and $\Delta Csd_{b2}$, respectively. Since the magnitudes of $Csd(A)_{b2}$ and $Csd(B)_{b2}$ can be independently adjusted by changing the magnitudes of the additional parasitic capacitances C1(b2) and C2(b2), the difference $\Delta Csd_{b2}$ (absolute value) can be reduced. By reducing $\Delta Csd_{b2}$ to a low level, the absolute value of β value (β(A−B) represented by formula (1)) can be reduced.

$$\Delta Csd_{b2}=|Csd(A)_{b2}-Csd(B)_{b2}|$$

$Csd(A)_{b2}$: including the normal parasitic capacitance CA(b2) and the additional parasitic capacitance C1(b2).

$Csd(B)_{b2}$: including the normal parasitic capacitance CB(b2) and the additional parasitic capacitance C2(b2).

The pixel electrode PEb2 partially overlaps the common electrode CE with the dielectric layer 17 interposed therebetween and thereby forms auxiliary capacitance Ct(b2). The auxiliary capacitance Ct(b2) is added to Cpi in formula (1), and therefore the β value can be further reduced.

The magnitudes of the additional parasitic capacitances C1 and C2 can be easily adjusted, for example, by adjusting the overlapping areas of the electrodes forming the parasitic capacitances. By adjusting the arrangement of the TFTs 20 and the pixel electrodes PE, the additional parasitic capacitances C1 and C2 can be controlled independently.

No particular limitation is imposed on the areas for the additional parasitic capacitances C1 and C2 (i.e., the areas of the portions X1 and X2). The areas of the portions X1 and X2 may each be from 0.1% to 10% inclusive of the area of the pixel electrodes PE. The area of the pixel electrodes PE may be, for example, several hundreds of $\mu m^2$ to several thousands of $\mu m^2$. No particular limitation is imposed on the line width of the oxide semiconductor layer 7 (the width of the low-resistance region), and the width may be, for example, about 3 μm.

No particular limitation is imposed on the magnitude relation between the areas for the additional parasitic capacitances C1 and C2. For example, when the other source parasitic capacitance excluding the additional parasitic capacitance is smaller than the own source parasitic capacitance excluding the additional parasitic capacitance, the area for the parasitic capacitance C2 may be larger than the area for the parasitic capacitance C1.

The layout of the pixel regions Px is not limited to the illustrated example. It is sufficient that the TFTs 20 and the pixel electrodes PE be disposed such that the oxide semiconductor layer 7 in each TFT 20 has portions overlapping the pixel electrodes PE of other pixel regions Px when viewed in the direction normal to the substrate 1. In the example illustrated, the oxide semiconductor layer 7 has an L shape including a portion extending in the column direction and a portion extending in the row direction when viewed in the direction normal to the substrate 1, but the plane shape of the oxide semiconductor layer 7 is not limited to the above shape. For example, the oxide semiconductor layer 7 may include a portion extending in an oblique direction (a direction intersecting the column direction and the row direction) or may include a portion extending along a source bus line SL in an overlapping manner. As described later, the oxide semiconductor layer 7 may not overlap the pixel electrode PE of another pixel region adjacent in the column direction (i.e., C1=0). Moreover, as described later, the TFTs 20 may be disposed such that their channel length direction is substantially parallel to the row direction (transverse TFT arrangement).

It is sufficient that each of the pixel TFTs disposed in the pixel regions Px be supported on the substrate and have the oxide semiconductor layer as an active layer. In the example illustrated, each of the pixel TFTs used is a top gate-type TFT 20 having the oxide semiconductor layer 7 disposed between the gate electrode GE and the substrate 1 but may be a bottom gate-type TFT having a gate electrode disposed between the oxide semiconductor layer and the substrate. However, the top gate-type TFT may be suitable because a region of the oxide semiconductor layer 7 that is other than the channel region 7c can be easily reduced in resistance and can be used as a transparent capacitance electrode.

In the present embodiment, the common electrode CE may be disposed on the pixel electrodes PE. When the common electrode CE is disposed on the pixel electrodes PE, the normal parasitic capacitances CA and CB formed between the pixel electrodes PE and the source bus lines SL are larger than those when the common electrode CE is disposed on the substrate 1 side of the pixel electrodes PE. Therefore, the formation of the additional parasitic capacitances C1 and C2 allows the β value to be reduced more effectively. The active matrix substrate may not include the common electrode CE. Such an active matrix substrate is applicable to a vertical electric field mode display device. In the vertical electric field mode display device, the common electrode CE is disposed on the counter substrate side.

Figure 12:
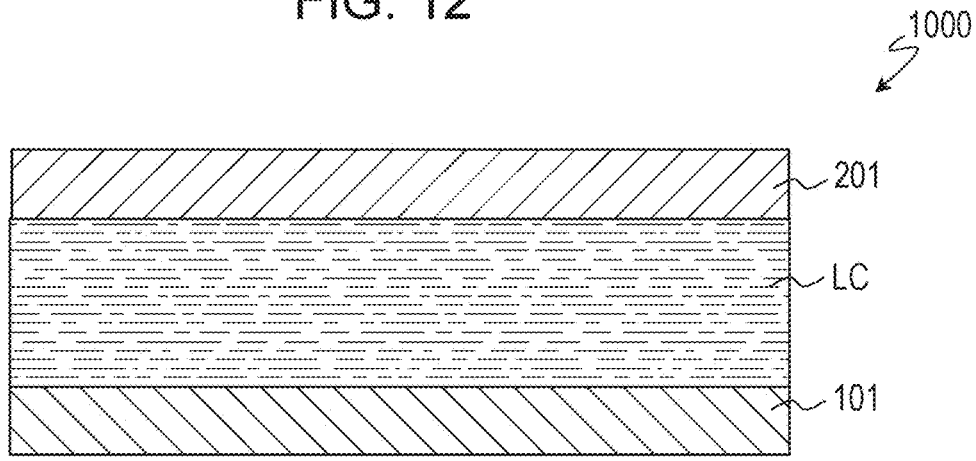
FIG. 12 is a sectional view of a liquid crystal display device using the active matrix substrate in FIG. 1.

The active matrix substrate 101 in the present embodiment is applicable to, for example, a liquid crystal display device. FIG. 12 is a schematic sectional view of a liquid crystal display device 1000 that uses the active matrix substrate 101. The liquid crystal display device 1000 includes the active matrix substrate 101, a counter substrate 201 disposed so as to be opposed to the active matrix substrate 101, and a liquid crystal layer LC disposed between the active matrix substrate 101 and the counter substrate 201.

The active matrix substrate 101 may be suitably used for a liquid crystal display device that performs, for example, column inversion driving. In the column inversion driving-type display device, a plurality of pixel electrodes in a pixel column are connected to the same source bus line SL. Data signals with the same polarity are written in a plurality of pixel electrodes forming one pixel column. Data signals with opposite polarity are written in pixel electrodes in a pixel column adjacent to the above pixel column. In this manner, pixel electrodes of pixels adjacent to each other in the row direction can have different voltage polarities. In the active matrix substrate used for the liquid crystal display device in which the column inversion driving is performed, pixel regions vertically adjacent to each other are connected to the same source bus line SL. In this arrangement, the other source parasitic capacitance Csd(B) tends to be smaller than the own source parasitic capacitance Csd(A). However, in the present embodiment, by arranging the TFTs 20 and the pixel electrodes PE such that the area for the additional parasitic capacitance C2 is larger than the area for the additional parasitic capacitance C1, the difference between the own source parasitic capacitance Csd(A) and the other source parasitic capacitance Csd(B) can be reduced, and the absolute value of the β value can be reduced.

The active matrix substrate 101 in the present embodiment is particularly suitably applicable to, for example, a display device that performs low-frequency driving. When the low-frequency driving is performed, flicker tends to occur due to a change in the brightness of pixels during a pause period. Therefore, the effect of reducing flicker that is obtained by the formation of the additional parasitic capacitances C1 and C2 can be more remarkable.

The present embodiment is also applicable to a display device that does not perform low-frequency driving. With the present embodiment, fluctuations in pixel potential due to parasitic capacitance can be reduced. Therefore, even when the low-frequency driving is not performed, the occurrence of flicker and a reduction in display quality due to fluctuations in pixel potential can be avoided. A suitable range of the β value or ΔCsd may vary depending on the driving frequency. For example, the lower the driving frequency, the smaller the absolute value of the β value needs to be (the closer the absolute value of the β value needs to be to 0). In the present embodiment, the magnitudes of the additional parasitic capacitances C1 and C2 may be adjusted such that the β value appropriate for the driving method used or the driving frequency used is obtained, so that the present embodiment is widely applicable to various display devices.

The present embodiment is particularly suitably applicable to a high-resolution active matrix substrate. As the resolution increases, Cpi in formula (1) deceases, and therefore the β value tends to increase. Therefore, the formation of the additional parasitic capacitances C1 and C2 allows the β value to be improved more effectively.

MODIFICATIONS

Modifications of the active matrix substrate in the present embodiment will be described with reference to the drawings. In the following figures, the same components as those in FIGS. 2A and 2B are denoted by the same reference symbols. Description of similar components may be appropriately omitted.

Modification 1

An active matrix substrate 102 in modification 1 differs from the active matrix substrate 101 in that each pixel electrode PE forms the additional parasitic capacitance C2 but does not form the additional parasitic capacitance C1.

Figure 3A:
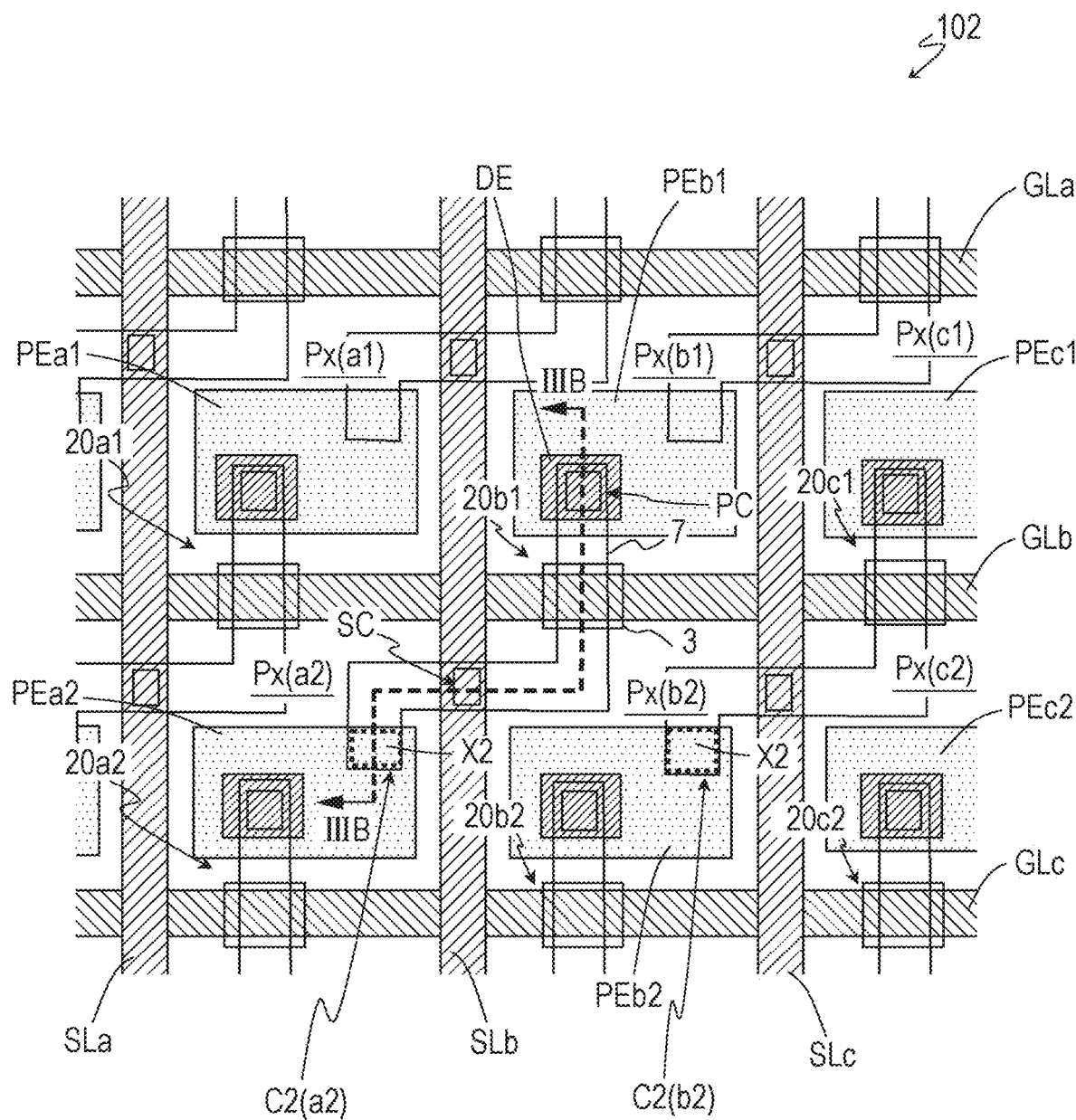
FIG. 3A is a plan view showing some pixel regions in an active matrix substrate in modification 1.
Figure 3B:
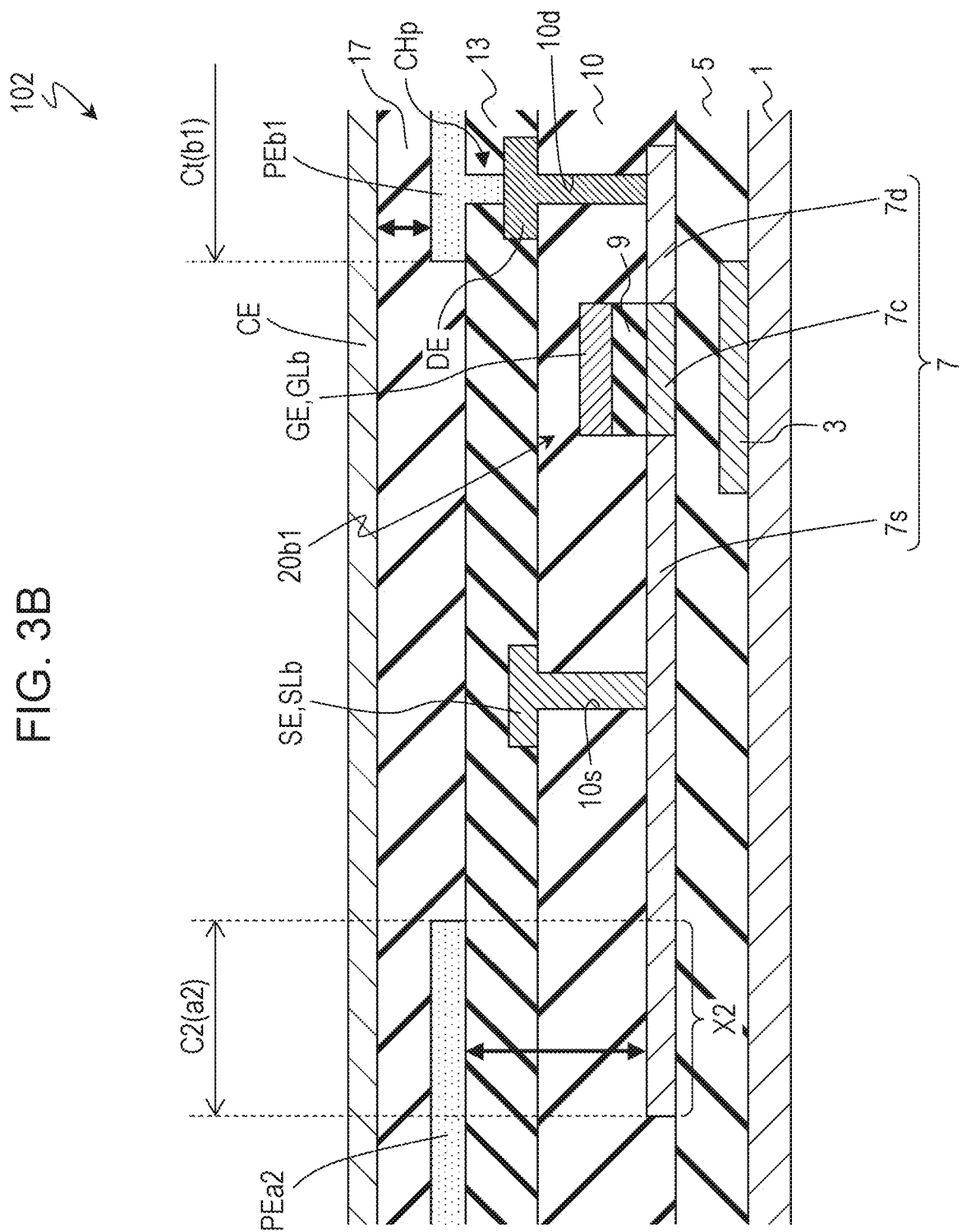
FIG. 3B is a sectional view taken along line IIIB-IIIB in FIG. 3A.

FIG. 3A is a plan view showing, for example, some pixel regions of the active matrix substrate 102 in modification 1. Six pixel regions Px(a1) to Px(c2) are shown, as in FIG. 2A. FIG. 3B is a sectional view taken along line IIIB-IIIB shown in FIG. 3A.

In modification 1, the first region 7s of the oxide semiconductor layer 7 in each TFT 20 includes a portion X2 that overlaps the pixel electrode PE of another pixel region Px adjacent in an oblique direction when viewed in the direction normal to the substrate 1. The portion X2, the pixel electrode PE of the other pixel region Px, and the insulating layer located therebetween form the additional parasitic capacitance C2 serving as the other source parasitic capacitance. The oxide semiconductor layer 7 in each TFT 20 does not overlap the pixel electrode PE of a pixel region Px adjacent in the column direction.

For example, when viewed in the direction normal to the substrate 1, the oxide semiconductor layer 7 in the TFT 20b1 partially overlaps the pixel electrode PEa2 within the pixel region Px(a2) adjacent in the oblique direction, and the additional parasitic capacitance C2($a2$) is formed between the oxide semiconductor layer 7 and the pixel electrode PEa2. Part of the oxide semiconductor layer 7 in the TFT 20b1 is located in the pixel region Px(b2) adjacent in the column direction but does not overlap the pixel electrode PEb2. Therefore, no parasitic capacitance (overlap capacitance) is formed between the oxide semiconductor layer 7 and the pixel electrode PEb2.

In the present embodiment, by adjusting the magnitude of the additional parasitic capacitance C2, the other source parasitic capacitance Csd(B) can be increased by a prescribed amount. Therefore, when Csd(B) is smaller than Csd(A), the absolute value of the β value in formula (1) can be reduced by increasing Csd(B).

For example, when the pixel region Px(b2) is the pixel of interest, $Csd(A)_{b2}$ includes the normal parasitic capacitance CA(b2) formed between the pixel electrode PEb2 of the pixel of interest and the source bus line SLb, and $Csd(B)_{b2}$ includes the normal parasitic capacitance CB(b2) formed between the pixel electrode PEb2 of the pixel of interest and the source bus line SLc. $Csd(B)_{b2}$ further includes the additional parasitic capacitance C2($b2$) formed between the pixel electrode PEb2 of the pixel of interest and the oxide semiconductor layer 7 in the TFT 20c1 of the pixel region Px(c1) adjacent obliquely. Therefore, by adjusting C2($b2$), the difference $\Delta Csd_{b2}$ (absolute value) between $Csd(A)_{b2}$ and $Csd(B)_{b2}$ can be adjusted.

$$\Delta Csd_{b2} = |Csd(A)_{b2} - Csd(B)_{b2}|$$

$Csd(A)_{b2}$: including the normal parasitic capacitance CA(b2).

$Csd(B)_{b2}$: including the normal parasitic capacitance CB(b2) and the additional parasitic capacitance C2($b2$).

Figure 4:
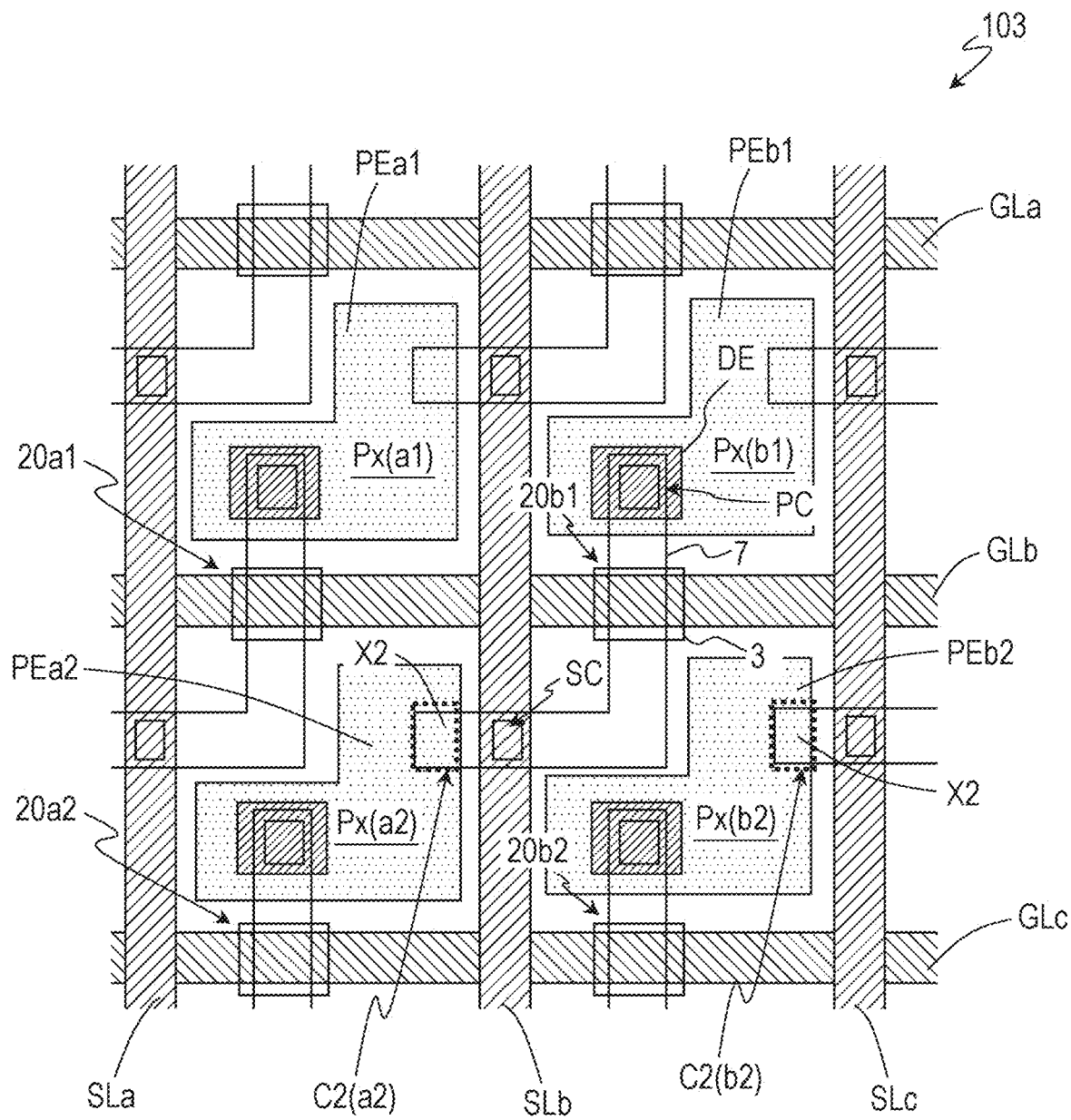
FIG. 4 is a plan view showing, for example, another active matrix substrate in modification 1.
Figure 5:
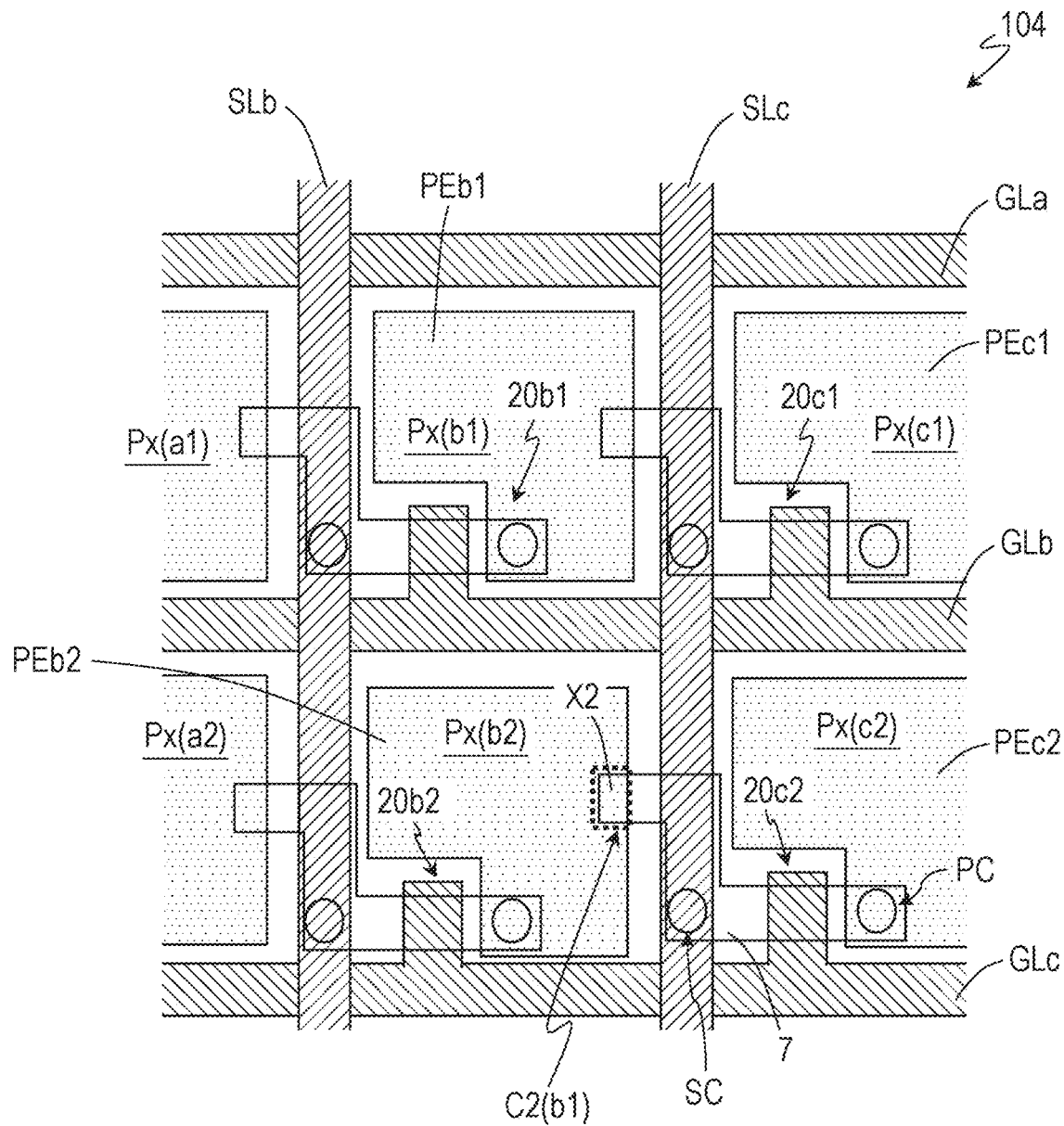
FIG. 5 is a plan view showing, for example, still another active matrix substrate in modification 1.

FIGS. 4 and 5 are plan views showing other active matrix substrates 103 and 104, respectively, in this modification.

As shown in FIG. 4, for example, the plane shape of the oxide semiconductor layer 7 in each TFT 20 may be the same as that in the active matrix substrate 101, and each pixel electrode PE may have a cutout portion so as not to form the additional parasitic capacitance C1 (so as not to overlap the oxide semiconductor layer 7 for a pixel region Px adjacent in the column direction).

Alternatively, as shown in FIG. 5, for example, the TFTs 20 may be disposed such that their channel length direction is substantially parallel to the row direction (the direction in which the gate bus lines GL extend) (transverse TFT arrangement). In this case, the oxide semiconductor layer 7 in each TFT 20 may extend so as to partially overlap the pixel electrode PE of a pixel region Px adjacent in the row direction when viewed in the direction normal to the substrate 1 to thereby form the additional parasitic capacitance C2.

In the following description, the TFT 20c2 shown in FIG. 5 is used as an example. The oxide semiconductor layer 7 in the TFT 20c2 extends in the row direction from the pixel contact portion PC so as to overlap the gate electrode GE (a branched portion of the gate bus line GLc in this case) when viewed in the direction normal to the substrate 1. A portion of the oxide semiconductor layer 7 that overlaps the gate electrode GE serves as the channel region. The first region of the oxide semiconductor layer 7 extends across the source bus line SLc and includes a portion X2 that overlaps the pixel electrode PEb2 within another pixel region Px(b2) adjacent in the row direction when viewed in the direction normal to the substrate 1. The portion X2, the pixel electrode PEb2, and the insulating layer located therebetween form the additional parasitic capacitance C2($b2$).

Modification 2

An active matrix substrate in modification 2 is used, for example, for a liquid crystal display device using a Z inversion driving method. By performing the Z inversion driving method, not only the pixel electrodes of pixels adjacent in the row direction but also the pixel electrodes of pixels adjacent in the column direction can have different voltage polarities.

Figure 6A:
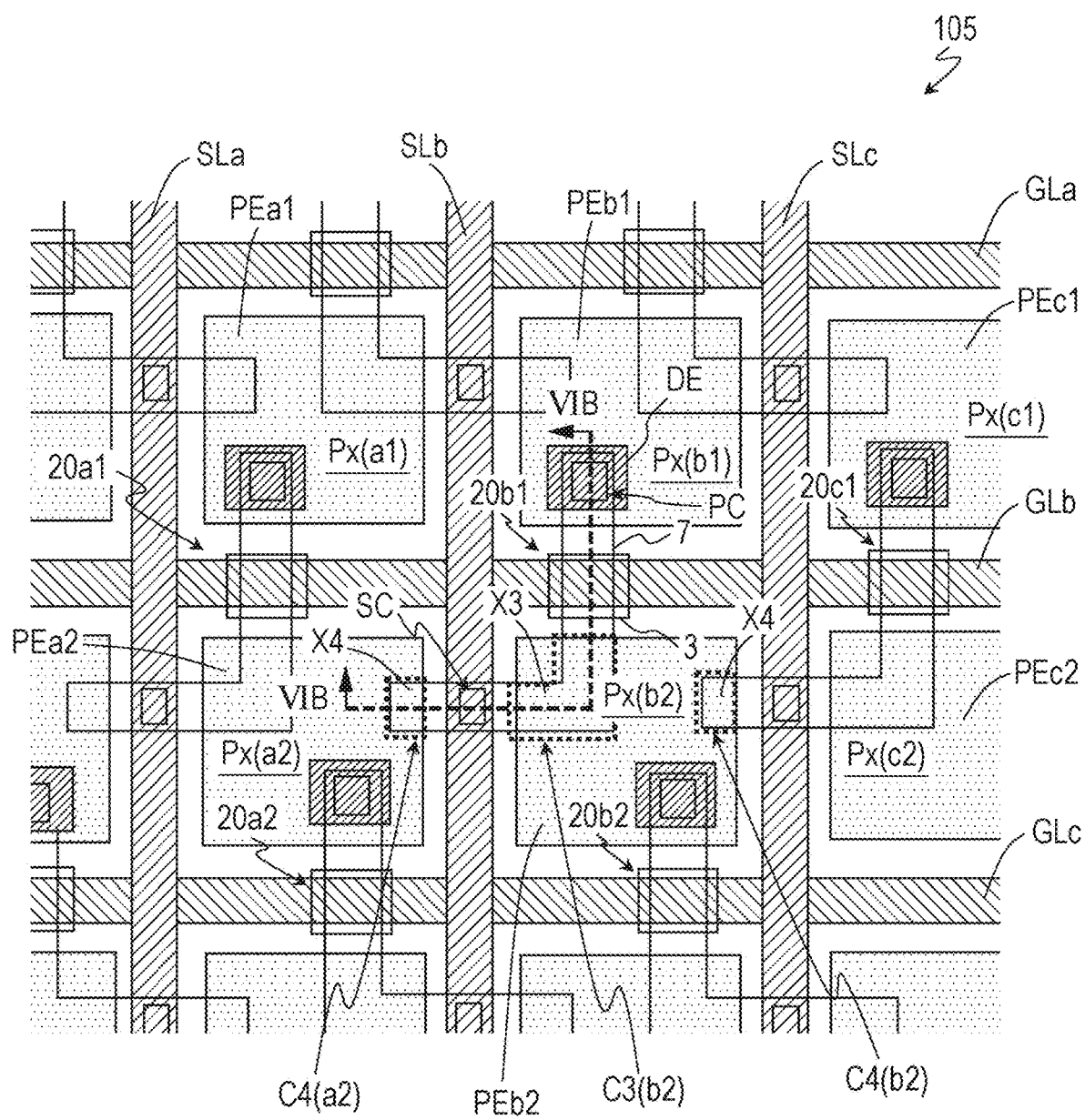
FIG. 6A is a plan view showing some pixel regions in an active matrix substrate in modification 2.
Figure 6B:
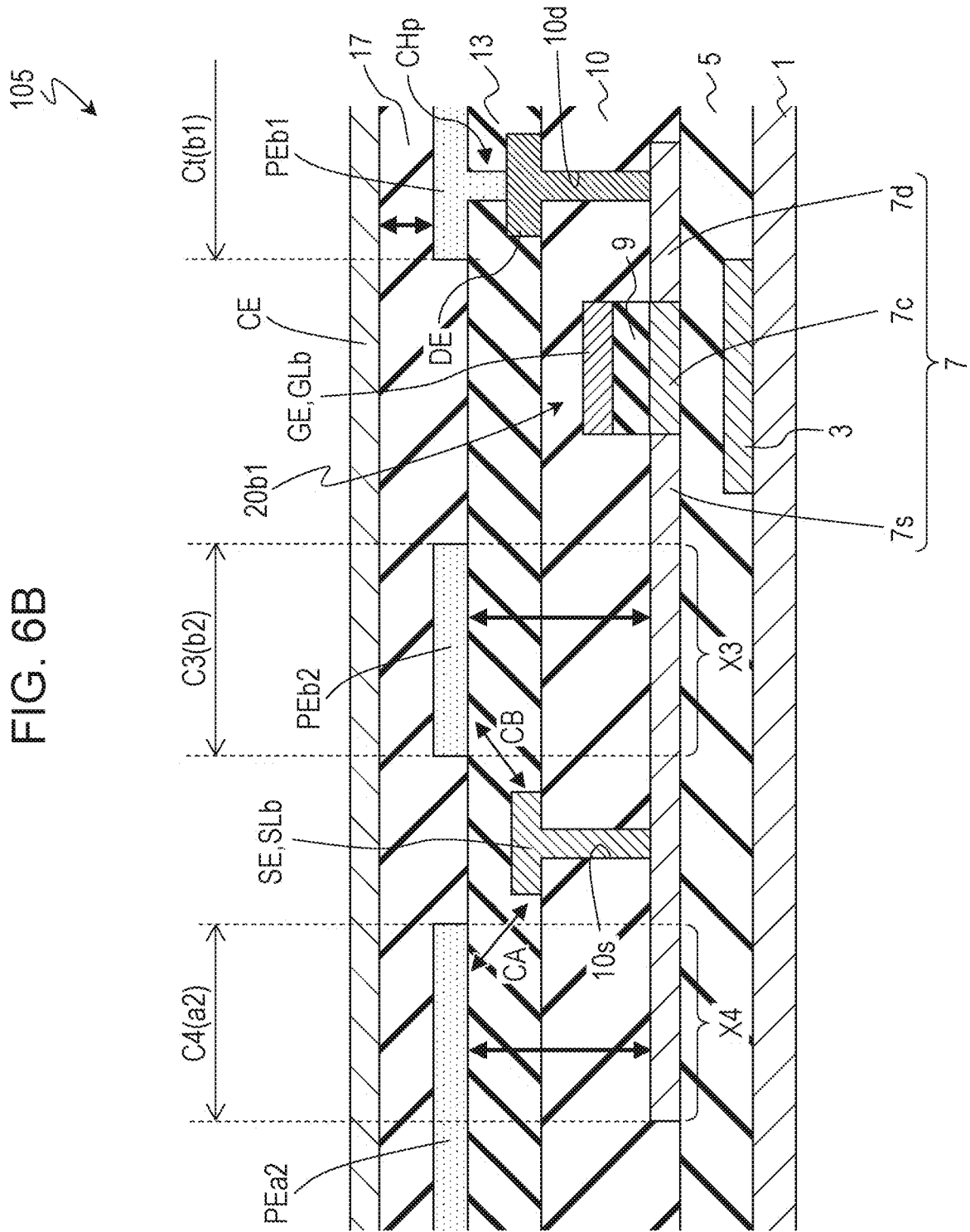
FIG. 6B is sectional view taken along line VIB-VIB in FIG. 6A.

FIG. 6A is a plan view showing, for example, some pixel regions in an active matrix substrate 105 in modification 2 and shows six pixel regions Px(a1) to Px(c2), as in FIG. 2A. FIG. 6B is a sectional view taken along line VIB-VIB in FIG. 6A.

In the active matrix substrate 105, each pixel electrode PE is connected to a source bus line SL different from source bus lines SL to which the pixel electrodes PE of pixel regions adjacent in the column direction and the row direction are connected. In this example, pixel rows including pixel electrodes PE connected to source bus lines SL located on the right side and pixel rows including pixel electrodes PE connected to source bus lines SL located on the left side are arranged alternately.

In the active matrix substrate 105 also, as in the active matrix substrate 101, the oxide semiconductor layer 7 in each TFT 20 includes: a portion X3 that overlaps the pixel electrode PE of a pixel region Px adjacent in the column direction; and a portion X4 that overlaps the pixel electrode PE of a pixel region Px adjacent in an oblique direction when viewed in the direction normal to the substrate 1. For example, the first region 7s of the oxide semiconductor layer 7 in the TFT 20b1 of the pixel region Px(b1) has: a portion X3 that overlaps the pixel electrode PEb2 of the pixel region Px(b2) adjacent in the column direction; and a portion X4 that overlaps the pixel electrode PEa2 of the pixel region Px(a2) adjacent in an oblique direction. The portion X3 overlaps the pixel electrode PEb2 of the pixel region Px(b2) with the insulating layers (the interlayer insulating layer 10 and the upper insulating layer 13 in this case) interposed therebetween to thereby form additional parasitic capacitance C3($b2$). Similarly, the portion X4 overlaps the pixel electrode PEa2 of the pixel region Px(a2) with the insulating layers (the interlayer insulating layer 10 and the upper insulating layer 13 in this case) interposed therebetween to thereby form additional parasitic capacitance C4($a2$). In the above description, the TFT 20b1 is used as an example. However, similarly, the oxide semiconductor layer 7 in each of the TFTs 20 in other pixel regions Px can form additional parasitic capacitance C3 between the oxide semiconductor layer 7 and the pixel electrode PE of a pixel region Px adjacent in the column direction and additional parasitic capacitance C4 between the oxide semiconductor layer 7 and the pixel electrode PE of a pixel region Px adjacent in an oblique direction.

The β value when the pixel region Px(b2) is used as a pixel of interest will be described. The pixel electrode PEb2 of the pixel region Px(b2) forms normal parasitic capacitance CA(b2) between itself and the source bus line SLc serving as the source bus line for the pixel of interest and normal parasitic capacitance CB(b2) between itself and the source bus line SLb serving as another source bus line. The pixel electrode PEb2 forms additional parasitic capacitance C3($b2$) between itself and the oxide semiconductor layer 7 in the TFT 20b1 of the pixel region Px(b1) adjacent in the column direction and forms additional parasitic capacitance C4($b2$) between itself and the oxide semiconductor layer 7 in the TFTs 20c1 of the pixel region Px(c1) adjacent in an oblique direction. In the present modification, the additional parasitic capacitance C3($b2$) is other source parasitic capacitance formed by the pixel electrode PEb2 and a transparent electrode (the first region 7s of the TFT 20b1) connected to another source bus line, and is added to Csd(B) in formula (1). The additional parasitic capacitance C4($b2$) is own source parasitic capacitance formed by the pixel electrode PEb2 and a transparent electrode (the first region 7s of the TFTs 20c1) connected to the source bus line for the pixel of interest, and is added to Csd(A) in formula (1). Therefore, in the present modification also, by adjusting the magnitudes of the additional parasitic capacitances C3($b2$) and C4($b2$), Csd(A)$_{b2}$ and Csd(B)$_{b2}$ can be adjusted independently, so that the difference ΔCsd$_{b2}$ (absolute value) between them can be reduced.

$$\Delta Csd_{b2}=|Csd(A)_{b2}-Csd(B)_{b2}|$$

Csd(A)$_{b2}$: including the normal parasitic capacitance CA(b2) and the additional parasitic capacitance C4($b2$).

Csd(B)$_{b2}$: including the normal parasitic capacitance CB(b2) and the additional parasitic capacitance C3($b2$).

Figure 7:
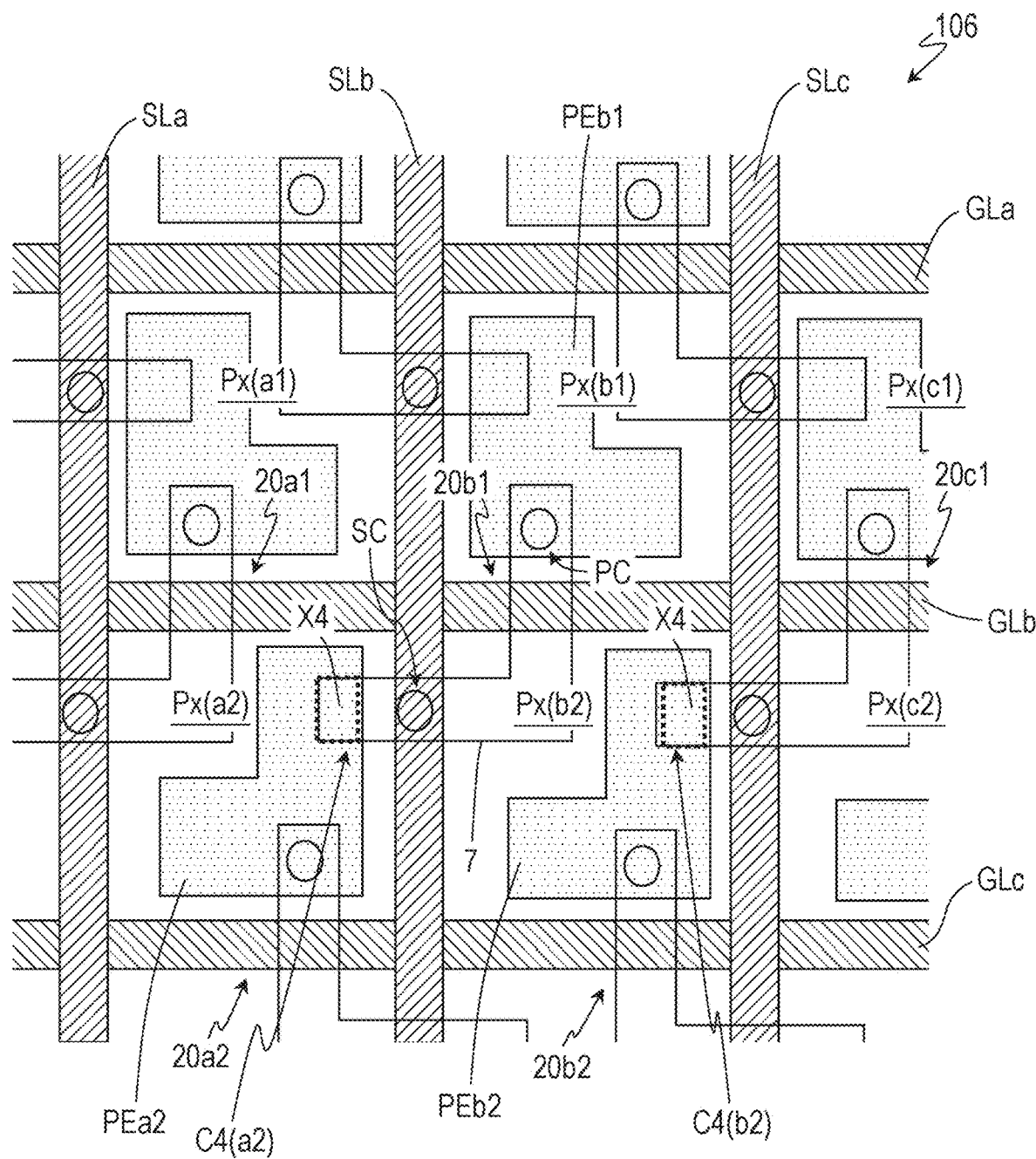
FIG. 7 is a plan view showing some pixel regions in another active matrix substrate in modification 2.

In the example shown in FIGS. 6A and 6B, the additional parasitic capacitance C3 and the additional parasitic capacitance C4 are formed. However, depending on the arrangement or shape of the pixel electrodes PE or the oxide semiconductor layer 7, only one of the additional parasitic capacitance C3 and the additional parasitic capacitance C4 may be formed. For example, as shown in FIG. 7, a cutout portion may be provided in each pixel electrode PE such that the pixel electrode PE does not overlap the oxide semiconductor layer 7 extending from a pixel region adjacent in the column direction. In this case, only the additional parasitic capacitance C3 is formed.

Although not illustrated, the transverse pixel TFT arrangement (see FIG. 5) may be employed. In this case, by extending the oxide semiconductor layer in each pixel TFT so as to overlap the pixel electrode of a pixel region adjacent in the row direction when the oxide semiconductor layer is viewed in the direction normal to the substrate, additional parasitic capacitance may be formed. In the present modification, since the pixel electrode of the pixel region adjacent in the row direction is connected to another source bus line, the additional parasitic capacitance is the other source parasitic capacitance.

Modification 3

In modification 3, each pixel electrode PE is disposed so as to partially overlap a source bus line SL for the pixel of interest and/or another source bus line SL when viewed in the direction normal to the substrate 1, and overlap capacitances serving as the own source parasitic capacitance and/or the other source parasitic capacitance are thereby formed.

Figure 8A:
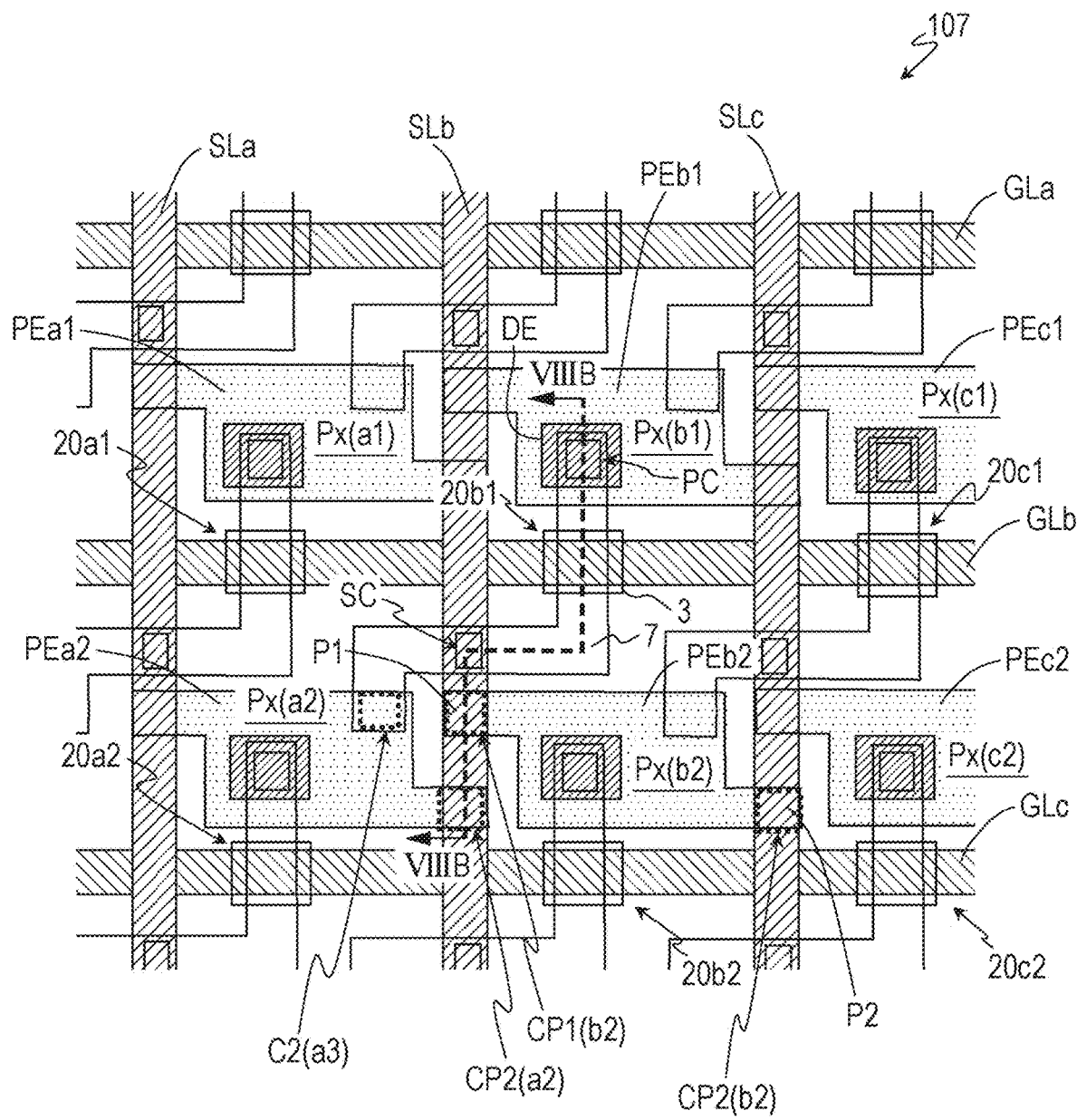
FIG. 8A is a plan view showing some pixel regions in an active matrix substrate in modification 3.
Figure 8B:
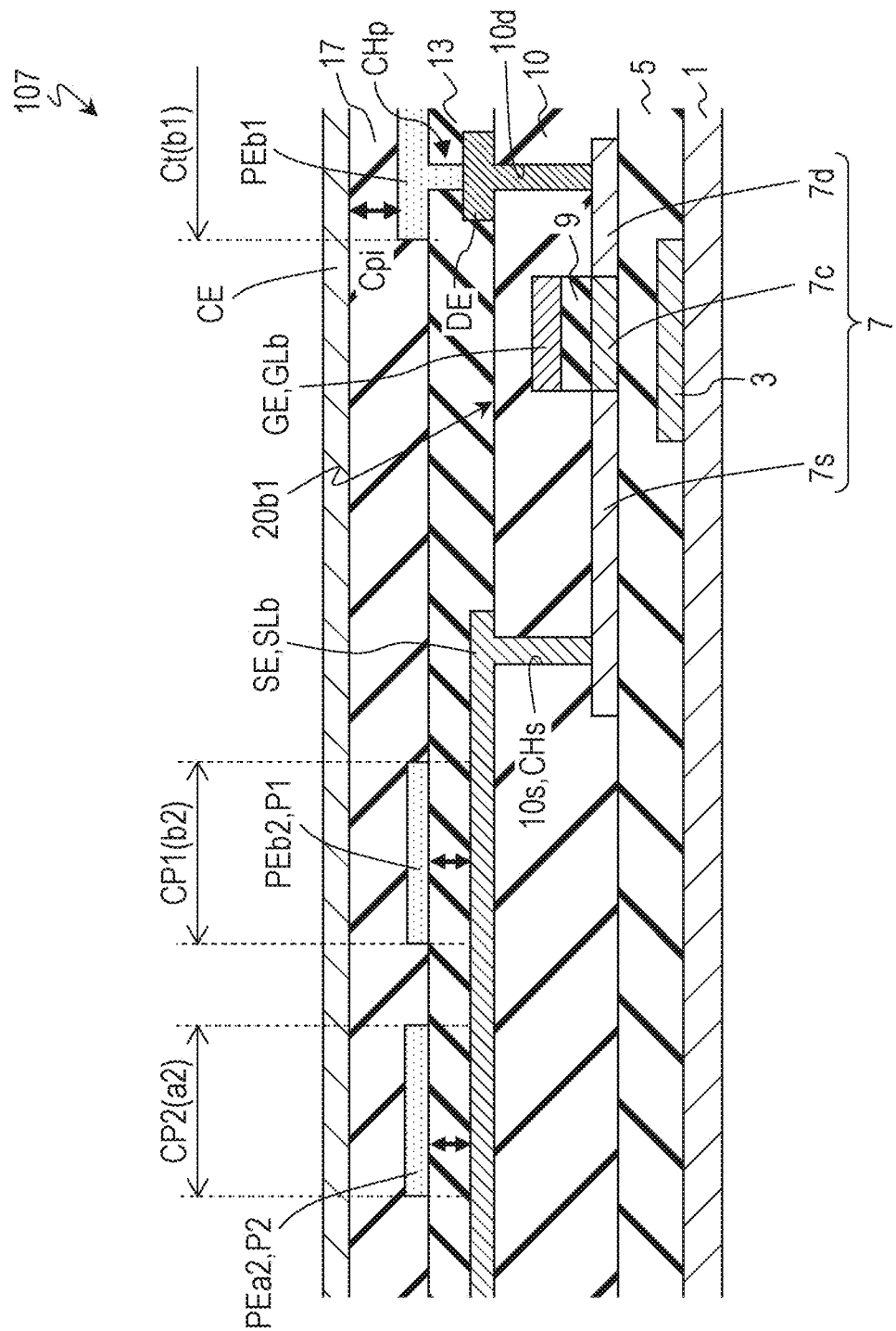
FIG. 8B is a sectional view taken along line VIIIB-VIIIB in FIG. 8A.

FIG. 8A is a plan view showing, for example, some pixel regions in an active matrix substrate 107 in modification 3 and shows the pixel regions Px(a1) to Px(c2), as in FIG. 2A. FIG. 8B is a sectional view taken along line VIIIB-VIIIB shown in FIG. 8A.

The active matrix substrate 107 differs from the active matrix substrate 102 in modification 1 in that each pixel electrode PE has portions P1 and P2 that overlap respective two source bus lines SL located on opposite sides when viewed in the direction normal to the substrate 1. In this example, the portion P1 overlaps the source bus line for the pixel of interest among the two source bus lines SL, and the portion P2 overlaps the other source bus line.

The portion P1 of the pixel electrode PE, the source bus line for the pixel of interest, and the insulating layer located therebetween (the upper insulating layer 13 in this case) form parasitic capacitance CP1. Similarly, the portion P2 of the pixel electrode PE, the other source bus line, and the insulating layer located therebetween (the upper insulating layer 13 in this case) form parasitic capacitance CP2. The parasitic capacitance CP1 is included in the own source parasitic capacitance Csd(A), and the parasitic capacitance CP2 is included in the other source parasitic capacitance Csd(B).

The pixel electrode PEb2 in the example illustrated will be described as an example. The pixel electrode PEb2 has portions (extending portions) P1 and P2 that extend to the source bus lines SLb and SLc, respectively, when viewed in the direction normal to the substrate 1. In this case, parasitic capacitance CP1($b2$) is formed between the pixel electrode PEb2 and the source bus line SLb that is the source bus line for the pixel of interest, and parasitic capacitance CP2($b2$) is formed between the pixel electrode PEb2 and the source bus line SLc that is the other source bus line. Similarly, each of the other pixel electrodes PE forms parasitic capacitances CP1 and CP2 between itself and source bus lines SL located on opposite sides.

As can be seen from FIG. 8B, only the upper insulating layer 13 is used as the dielectric insulating layer for the parasitic capacitances CP1 and CP2, and the thickness of their dielectric insulating layer is smaller than that for the additional parasitic capacitances C1 to C4. Therefore, even when the overlapping area is small, a sufficient capacitance can be obtained. By adjusting the overlapping areas for the parasitic capacitances CP1 and CP2, the difference between the own source parasitic capacitance Csd(A) and the other source parasitic capacitance Csd(B) can be further reduced.

For example, let the pixel electrode PEb2 be the pixel electrode of the pixel of interest. Then Csd(A)$_{b2}$ includes the normal parasitic capacitance CA(b2) and the parasitic capacitance CP1($b2$), and Csd(B)$_{b2}$ includes the normal parasitic capacitance CB(b2), the additional parasitic capacitance C2($b2$), and the parasitic capacitance CP2($b2$). Therefore, the difference $\Delta Csd_{b2}$ (absolute value) between Csd(A)$_{b2}$ and Csd(B)$_{b2}$ can be adjusted not only by adjusting C2($b2$) but also by adjusting the parasitic capacitances CP1($b2$) and CP2($b2$).

$\Delta Csd_{b2}=|Csd(A)_{b2}-Csd(B)_{b2}|$

Csd(A)$_{b2}$: including the normal parasitic capacitance CA(b2) and the parasitic capacitance CP1($b2$).

Csd(B)$_{b2}$: including the normal parasitic capacitance CB(b2), the additional parasitic capacitance C2($b2$), and the parasitic capacitance CP2($b2$).

To form the parasitic capacitances CP1 and CP2, the pixel electrodes PE may be disposed such that the portion P1 of each pixel electrode PE does not overlap the portion P2 of an adjacent pixel electrode PE. In one source bus line SL, portions P1 and P2 of two pixel electrodes PE located on opposite sides may be disposed, for example, with a space provided in the column direction. The width of the portions P1 and P2 in the row direction may be equal to or more than ½ the width of the source bus lines SL.

The structure of the present modification is not limited to the structure shown in FIGS. 8A and 8B. For example, each of the pixel electrodes PE may have only one of the portions P1 and P2 that overlap the source bus line for the pixel of interest and the other source bus line, respectively.

Figure 9:
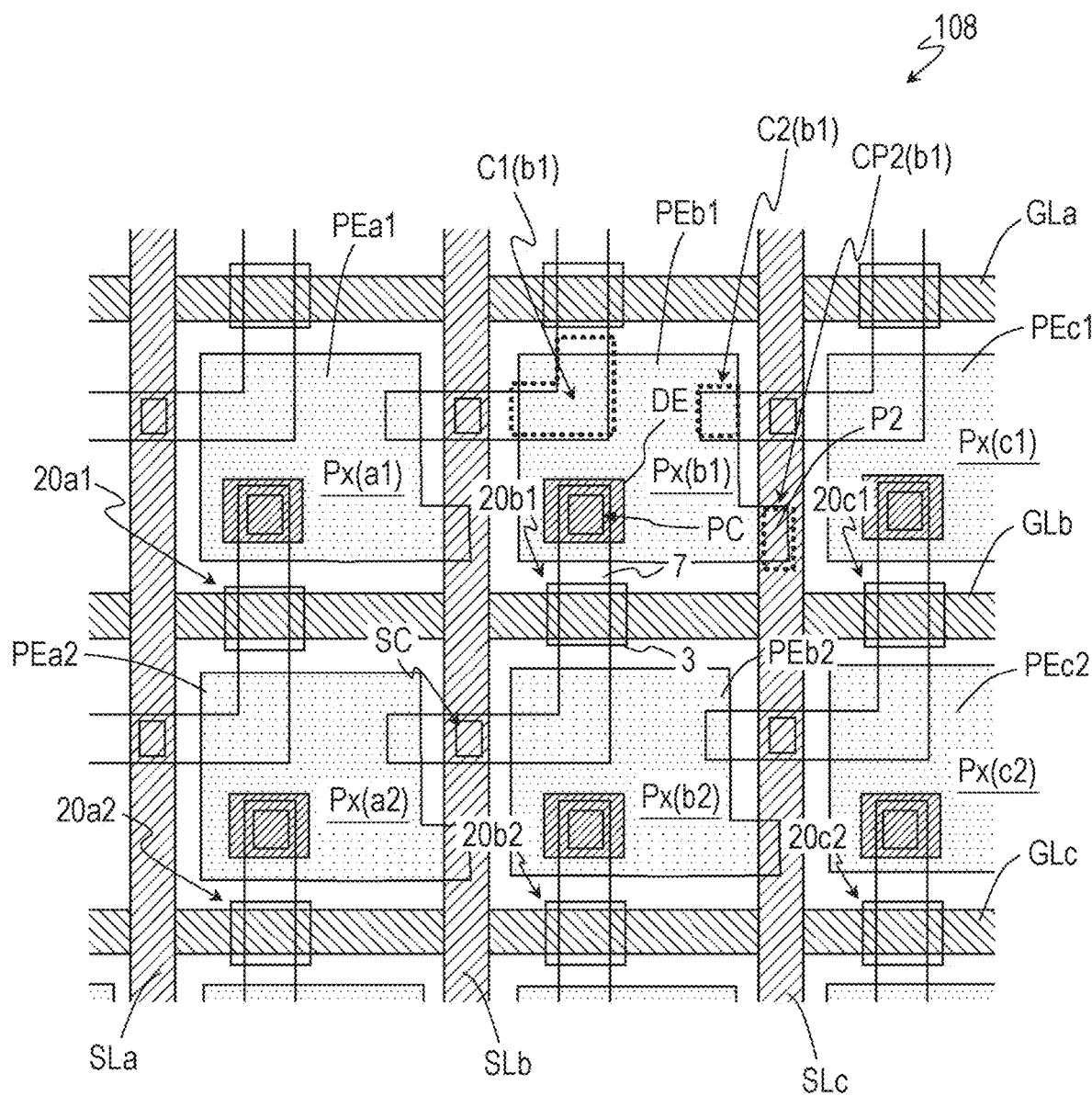
FIG. 9 is a plan view showing some pixel regions in another active matrix substrate in modification 3.

FIG. 9 is a plan view showing, for example, some pixel regions in another active matrix substrate 108 in modification 3. The active matrix substrate 108 differs from the active matrix substrate 101 shown in FIGS. 2A and 2B in that each of the pixel electrodes PE has a portion P2 that overlaps another source bus line when viewed in the direction normal to the substrate 1. Each of the pixel electrodes PE in the active matrix substrate 108 does not have a portion that overlaps a source bus line for the pixel of interest. In addition to the additional parasitic capacitance C2, the additional parasitic capacitance C1 is formed.

For example, let the pixel electrode PEb2 in this example be the pixel electrode of the pixel of interest. Then, Csd(A)$_{b2}$ includes the normal parasitic capacitance CA(b2) and the additional parasitic capacitance C1($b2$), and Csd(B)$_{b2}$ includes the normal parasitic capacitance CB(b2), the additional parasitic capacitance C2($b2$), and parasitic capacitance CP2($b2$). For example, when the other source parasitic capacitance is smaller than the own source parasitic capacitance, this structure is suitably used because only the other source parasitic capacitance Csd(B) can be increased.

In FIGS. 8A and 9, the parasitic capacitances CP1 and CP2 are formed by extending the pixel electrodes PE to the source bus lines SL. Alternatively, the parasitic capacitance CP1 and/or the parasitic capacitance CP2 may be formed by providing, for the source bus lines SL, extending portions that overlap pixel electrodes PE located on opposite sides or one side when viewed in the direction normal to the substrate 1 or by bending the source bus lines SL so as to overlap the pixel electrodes PE.

It is sufficient that the active matrix substrate in the present modification have at least one of the additional parasitic capacitance C1 to C4 and at least one of the parasitic capacitances CP1 and CP2, and any combination of them may be used. This allows the desired β value to be achieved while layout flexibility is increased.

Modification 4

An active matrix substrate 109 in modification 4 differs from the active matrix substrates 107 and 108 in modification 3 in that the parasitic capacitance CP1 and/or the parasitic capacitance CP2 is formed while the parasitic capacitance between the oxide semiconductor layer in each pixel TFT and the corresponding pixel electrode is not formed.

Figure 10:
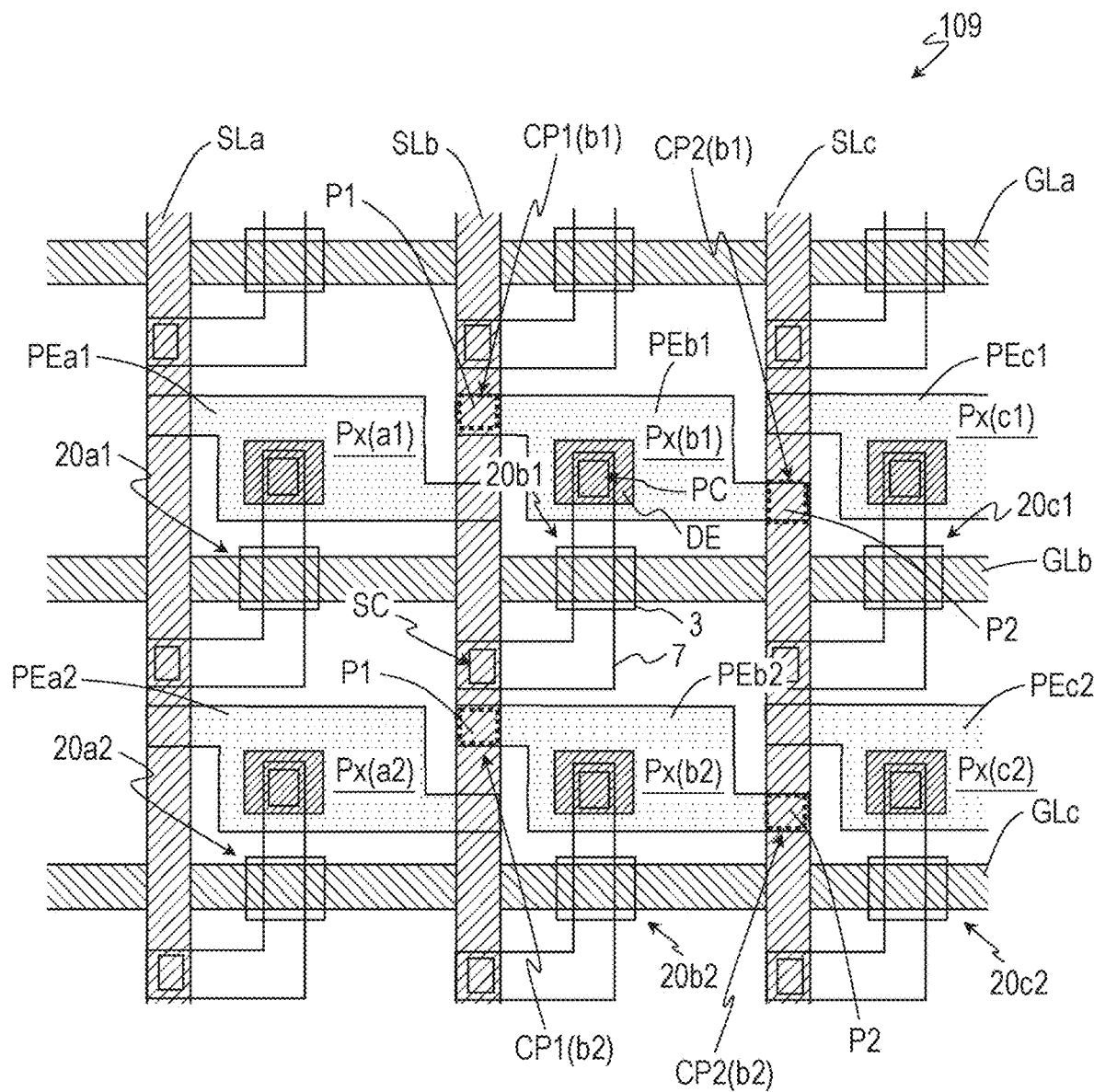
FIG. 10 is a plan view showing some pixel regions in an active matrix substrate in modification 4.

FIG. 10 is a plan view showing, for example, some pixel regions in the active matrix substrate 109 in modification 4. The sectional structure of the parasitic capacitances CP1 and CP2 is the same as that in the active matrix substrate 107 (FIG. 8B), and therefore the illustration of the sectional structure is omitted.

In this example, each of the pixel electrodes PE has a portion P1 that overlaps a source bus line for the pixel of interest and a portion P2 that overlaps another source bus line when viewed in the direction normal to the substrate 1. In this case, parasitic capacitance CP1 serving as the own source parasitic capacitance Csd(A) and parasitic capacitance CP2 serving as the other source parasitic capacitance Csd(B) are formed.

In the following description, the pixel electrode PEb2 is used as an example. The pixel electrode PEb2 has portions (extending portions) P1 and P2 that extend to the source bus lines SLb and SLc, respectively, when viewed in the direction normal to the substrate 1. In this case, parasitic capacitance CP1($b2$) is formed between the pixel electrode PEb2 and the source bus line SLb that is the source bus line for the pixel of interest, and parasitic capacitance CP2($b2$) is formed between the pixel electrode PEb2 and the source bus line SLc that is another source bus line. Let the pixel electrode PEb2 be the pixel of interest. Then, Csd(A)$_{b2}$ includes the parasitic capacitance CP1($b2$), and Csd(B)$_{b2}$ includes the parasitic capacitance CP2($b2$). The same applies to the other pixel electrodes PE.

In the present modification, by adjusting the overlapping areas for the parasitic capacitances CP1 and CP2, $\Delta$Csd can be reduced, and the β value can be improved.

To form the parasitic capacitances CP1 and CP2, the pixel electrodes PE may be disposed such that the portions P1 and P2 of each pixel electrode PE do not overlap adjacent pixel electrodes PE, as in modification 3. In one source bus line SL, portions P1 and P2 of two pixel electrodes PE located on opposite sides may be disposed, for example, with a space provided in the column direction. The width of the portions P1 and P2 in the row direction may be equal to or more than ½ the width of the source bus lines SL.

In FIG. 10, both the parasitic capacitances CP1 and CP2 are formed. However, only one of them may be formed. For example, each pixel electrode PE may overlap only one of the source bus line SL for the pixel of interest and the other source bus line SL when viewed in the direction normal to the substrate 1.

In FIG. 10, the parasitic capacitances CP1 and CP2 are formed by extending the pixel electrodes PE to the source bus lines SL. Alternatively, the parasitic capacitance CP1 and/or the parasitic capacitance CP2 may be formed by providing, for the source bus lines SL, extending portions that overlap pixel electrodes PE located on opposite sides or one side when viewed in the direction normal to the substrate 1 or by bending the source bus lines SL so as to overlap the pixel electrodes PE.

(Arrangement of Pixel Regions)

In the present specification, the pixel of interest may be referred to as a "first pixel region", and the pixel electrode and the pixel TFT of the first pixel region may be referred to as a "first pixel electrode" and a "first TFT", respectively. Among a plurality of pixel regions adjacent to the first pixel region in the column direction, the row direction, or an oblique direction, one pixel region including a pixel electrode PE connected to the source bus line SL to which the first pixel electrode is connected (i.e., the source bus line for the pixel of interest) may be referred to as a "second pixel region", and one pixel region including a pixel electrode PE connected to a source bus line SL (another source bus line) different from the source bus line SL to which the first pixel electrode is connected may be referred to as a "third pixel region". The pixel electrode and the pixel TFT of the second pixel region may be referred to as a "second pixel electrode" and a "second TFT", respectively, and the pixel electrode and the pixel TFT of the third pixel region may be referred to as a "third pixel electrode" and a "third TFT", respectively.

The first pixel electrode of the first pixel region (the pixel of interest) has a first portion that overlaps the oxide semiconductor layer in the second TFT of the second pixel region and a second portion that overlaps the oxide semiconductor layer in the third TFT of the third pixel region when viewed in the direction normal to the substrate 1. The first portion of the first pixel electrode, the oxide semiconductor layer in the second TFT, and the insulating layer located therebetween form additional parasitic capacitance (referred to as "first capacitance"). The first capacitance is added to the own source parasitic capacitance. The second portion of the first pixel electrode, the oxide semiconductor layer in the third TFT, and the insulating layer located therebetween form additional parasitic capacitance (referred to as "second capacitance"). The second capacitance is added to the other source parasitic capacitance. Therefore, the own source parasitic capacitance Csd(A) and the other source parasitic capacitance Csd in formula (1) can be controlled independently.

No particular limitation is imposed on the arrangement of the pixel regions. For example, in an active matrix substrate of a display device in which column inversion driving is performed, a pixel region adjacent to the first pixel region (the pixel of interest) in the column direction may be the "second pixel region", and a pixel region adjacent to the first pixel region in the row direction or an oblique direction may be the "third pixel region". As described later, in an active matrix substrate of a display device in which Z inversion driving is performed, for example, a pixel region adjacent to the first pixel region in an oblique direction may be the "second pixel region", and a pixel region adjacent to the first pixel region in the column direction or the row direction may be the "third pixel region".

For example, in the example shown in FIG. 2A, a pixel region adjacent to the first pixel region in the column direction is the "second pixel region", and a pixel region adjacent to the first pixel region in an oblique direction is the "third pixel region". The additional parasitic capacitance C1 is the "first capacitance", and the additional parasitic capacitance C2 is the "second capacitance".

In the example shown in FIG. 6A, a pixel region adjacent to the first pixel region in an oblique direction is the "second pixel region", and a pixel region adjacent in the column direction is the "third pixel region". The additional parasitic capacitance C3 has a structure similar to the structure of the additional parasitic capacitance C1 shown in FIG. 2A but is included in the other source parasitic capacitance and corresponds to the "second capacitance", as does the additional parasitic capacitance C2. The additional parasitic capacitance C4 has a structure similar to the structure of the additional parasitic capacitance C2 shown in FIG. 2A but is included in the own source parasitic capacitance and corresponds to the "first capacitance", as does the additional parasitic capacitance C1.

(Method for Producing Active Matrix Substrate)

Figure 11:
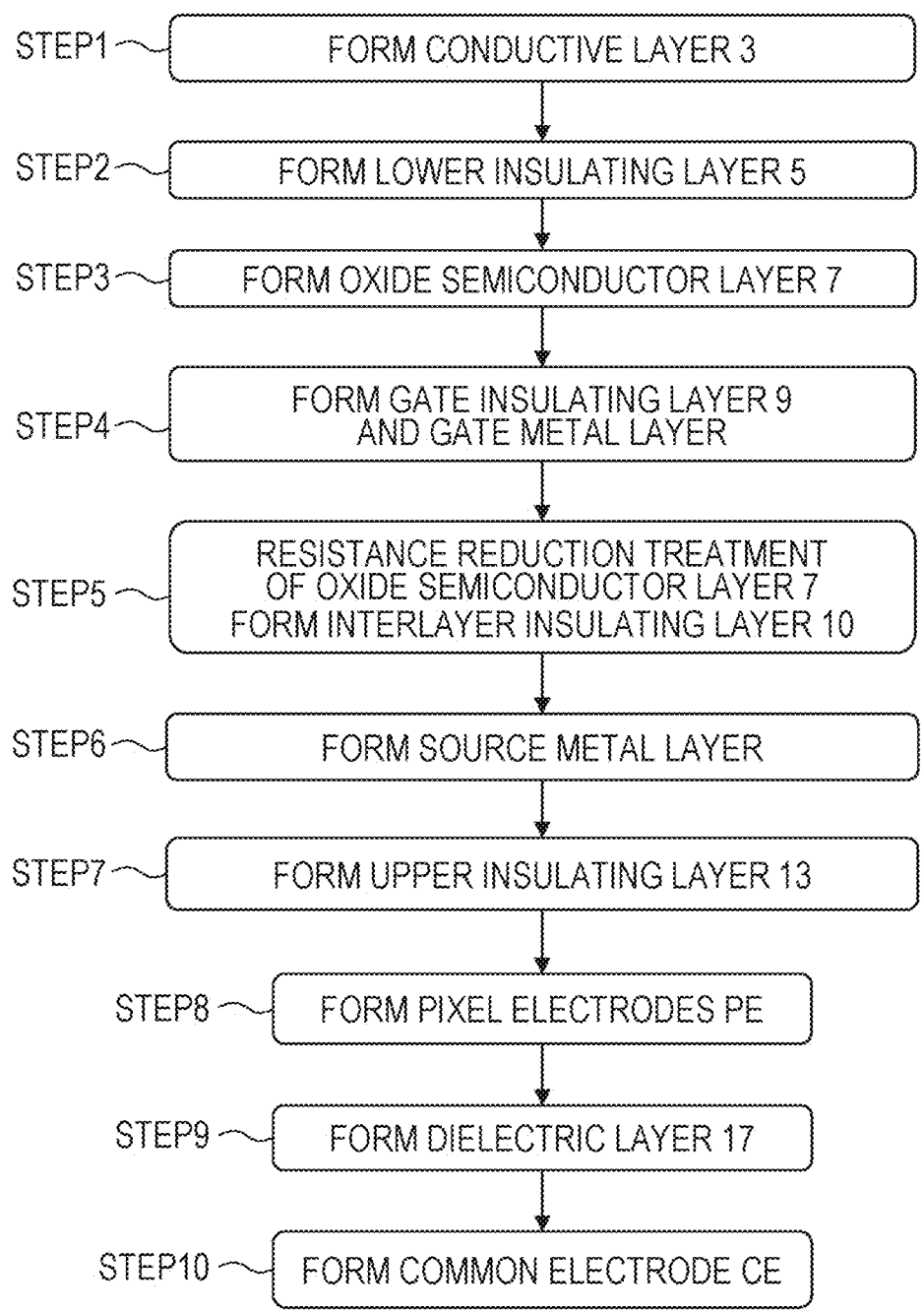
FIG. 11 is a diagram showing a process flow explaining an example of a method for producing the active matrix substrate in FIG. 1.

Next, an example of a method for producing the active matrix substrate in the present embodiment will be described using the active matrix substrate 101 shown in FIGS. 2A and 2B as an example. FIG. 11 is a diagram showing a process flow explaining the example of the method for producing the active matrix substrate 101. The active matrix substrates 102 to 109 in the modifications can be produced using a similar method with the arrangement and shapes of the pixel electrodes PE and the oxide semiconductor layer 7 changed appropriately.

Step 1: Formation of Conductive Layer 3

A first conductive film (thickness: for example, from 50 nm to 500 nm inclusive) is formed on a substrate 1 using, for example, a sputtering method. Next, a known photolithographic process is used to pattern the first conductive film (for example, by wet etching) to thereby form a lower metal layer including a plurality of islands of the conductive layer 3. The conductive layer 3 serves as a light shield layer for the pixel TFTs.

The substrate 1 used may be a transparent insulating substrate such as a glass substrate, a silicon substrate, a heat-resistant plastic substrate (resin substrate), etc.

No particular limitation is imposed on the material of the first conductive film, and a film containing a metal such as aluminum (Al), tungsten (W), molybdenum (Mo), tantalum (Ta), chromium (Cr), titanium (Ti), or copper (Cu), an alloy thereof, or a metal nitride thereof may be appropriately used. A layered film obtained by staking a plurality of films may also be used.

Step 2: Formation of Lower Insulating Layer 5

Next, the lower insulating layer 5 (thickness: for example, from 200 nm to 600 nm inclusive) is formed so as to cover the lower metal layer.

The lower insulating layer 5 is formed, for example, by a CVD method. A silicon oxide (SiOx) layer, a silicon nitride (SiNx) layer, a silicon oxide nitride (SiOxNy: x>y) layer, a silicon nitride oxide (SiNxOy: x>y) layer, etc. may be appropriately used as the lower insulating layer 5. The lower insulating layer 5 may be a monolayer or may have a layered structure. For example, a silicon nitride (SiNx) layer, a silicon nitride oxide layer, etc. may be formed on the substrate side (as a lower layer) in order to reduce diffusion of impurities etc., and a silicon oxide ($SiO_2$) layer, a silicon oxide nitride layer, etc. may be formed on the layer formed (as an upper layer) in order to obtain insulation. In this example, a layered film including a silicon nitride (SiNx) layer (thickness: 50 to 600 nm) serving as the lower layer and a silicon oxide ($SiO_2$) layer (thickness: 50 to 600 nm) serving as the upper layer may be formed as the lower insulating layer 5. When an oxide layer such as a silicon oxide film is used as the lower insulating layer 5 (as the uppermost layer when the lower insulating layer 5 has a layered structure), the oxide film can reduce oxygen deficiency in the channel regions in the oxide semiconductor layer to be formed, and a reduction in the resistance of the channel regions can be avoided.

Step 3: Formation of Oxide Semiconductor Layer 7

Next, an oxide semiconductor film is formed on the lower insulating layer 5. Then the oxide semiconductor film may be subjected to annealing treatment. The thickness of the oxide semiconductor film may be, for example, from 15 nm to 200 nm inclusive.

Next, a known photolithographic process is used to pattern the oxide semiconductor film. The oxide semiconductor film may be patterned by wet etching using, for example, a PAN-based etching solution containing phosphoric acid, nitric acid, and acetic acid or an oxalic acid-based etching solution. A plurality of islands of the oxide semiconductor layer 7 are thereby obtained. The oxide semiconductor layer 7 serves as the active layer of each pixel TFT. The oxide semiconductor film may be formed, for example, by a sputtering method. In this example, an In—Ga—Zn—O-based semiconductor film (thicknesss: about 50 nm) containing In, Ga, and Zn is formed as the oxide semiconductor film.

Step 4: Formation of Gate Insulating Layer and Gate Metal Layer

Next, a gate insulating film (thickness: for example, from 80 nm to 250 nm inclusive) and a gate conductive film (thickness: for example, from 50 nm to 500 nm inclusive) are formed in this order so as to cover the oxide semiconductor layer 7 in each of the pixel TFTs.

The gate insulating film used may be the same insulating film as that used for the lower insulating layer 5 (any of the insulating films exemplified for the lower insulating layer 5). In this example, a silicon oxide ($SiO_2$) layer is formed as the gate insulating film. When an oxide film such as a silicon oxide film is used as the insulating film, the oxide film can reduce oxygen deficiency in the channel regions in the oxide semiconductor layer 7, and a reduction in the resistance of the channel region can be avoided.

A metal such as molybdenum (Mo), tungsten (W), aluminum (Al), copper (Cu), titanium (Ti), or tantalum (Ta) or an alloy thereof may be used for the gate conductive film. The gate conductive film may have a layered structure including a plurality of layers formed of different conductive materials. In this example, the gate conductive film used is a Cu/Ti layered film including a Ti film as a lower layer and a Cu film as an upper layer or a Cu/Mo layered film including a Mo film as a lower layer and a Cu film as an upper layer.

Then a resist layer is formed on the gate conductive film, and the gate conductive film is patterned using the resist layer as a mask to thereby form a gate metal layer including the gate electrodes GE of the pixel TFTs and a plurality of gate bus lines GL. Next, the gate insulating film is etched using the resist layer or the gate metal layer as a mask, and the gate insulating layer 9 in each pixel TFT is thereby obtained. In this manner, regions of the oxide semiconductor layer 7 that overlap the gate electrodes GE with the gate insulating layer 9 interposed therebetween become the channel regions 7c.

Step 5: Resistance Reduction Treatment of Oxide Semiconductor Layer 7 and Formation of Interlayer Insulating Layer 10

Next, the oxide semiconductor layer 7 may be subjected to resistance reduction treatment to form low-resistance regions. The resistance reduction treatment performed may be, for example, plasma treatment. In this manner, exposed regions of the oxide semiconductor layer 7 that are located on opposite sides of the channel regions 7c when viewed in the direction normal to the principal surface of the substrate 1 become low-resistance regions having a lower specific resistance than the channel regions 7c. The low-resistance regions may be conductor regions (for example, sheet resistance: 200 Ω/square or less). The low-resistance regions include first regions 7s located on the source side of the channel regions 7c and second regions 7d located on the drain side.

Next, the interlayer insulating layer 10 is formed so as to cover the oxide semiconductor layer 7, the gate insulating layer 9, and the gate metal layer in each pixel TFT. The interlayer insulating layer 10 may be formed as an inorganic insulating monolayer such as a silicon oxide film, a silicon nitride film, a silicon oxide nitride film, or a silicon nitride oxide or a stack of any of these layers. The thickness of the inorganic insulating layer may be from 100 nm to 500 nm inclusive. When the interlayer insulating layer 10 is formed using an insulating film such as a silicon nitride film that reduces an oxide semiconductor, the specific resistance of regions of the oxide semiconductor layer 7 that are in contact with the interlayer insulating layer 10 (the low-resistance regions in this case) may be kept low. In this example, for example, a layered film including a SiO$_2$ layer as a lower layer and a SiNx layer as an upper layer may be formed as the interlayer insulating layer 10 by a CVD method.

The exposed regions of the oxide semiconductor layer 7 may be subjected to the following resistance reduction treatment instead of the plasma treatment. Specifically, the exposed regions of the oxide semiconductor layer 7 are brought into contact with an interlayer insulating layer 10 including an insulating film such as a silicon nitride film that reduces the oxide semiconductor.

Then, for example, dry etching is performed to pattern the interlayer insulating layer 10. In this manner, the first openings 10s through which part of the first region 7s of the oxide semiconductor layer 7 is exposed and the second openings 10d through which part of the second regions 7d are exposed are formed in the interlayer insulating layer 10.

Step 6: Formation of Source Metal Layer

Next, a source conductive film (thickness: for example, from 50 nm to 500 nm inclusive) is formed on the interlayer insulating layer 10 and patterned. In this manner, a source metal layer including the source electrode SE and the drain electrode DE of each pixel TFT and a plurality of source bus lines SL is formed. The TFTs 20 are thereby produced as pixel TFTs in the respective pixel regions.

For example, an element selected from aluminum (Al), chromium (Cr), copper (Cu), tantalum (Ta), titanium (Ti), molybdenum (Mo), and tungsten (W) or an alloy containing any of these elements may be used for the source conductive film. For example, a three-layer structure including a titanium film/an aluminum film/a titanium film or a three-layer structure including a molybdenum film/an aluminum film/a molybdenum film may be used. In this example, a layered film including a Ti film (thickness: 15 to 70 nm) serving as a lower layer and a Cu film (thickness: 200 to 400 nm) serving as an upper layer may be used.

Step 7: Formation of Upper Insulating Layer 13

Next, the upper insulating layer 13 is formed so as to cover the interlayer insulating layer 10 and the source metal layer. In this example, an inorganic insulating layer (thickness: for example, from 100 nm to 500 nm inclusive) and an organic insulating layer (thickness: for example, 1 to 3 μm and preferably 2 to 3 μm) are formed in this order as the upper insulating layer 13. The entire portion of the organic insulating layer that is located in a non-display region may be removed. Alternatively, the organic insulating layer may not be formed.

The inorganic insulating layer used may be the same inorganic insulating film as that used for the interlayer insulating layer 10 (any of the insulating films exemplified for the interlayer insulating layer 10). In this example, for example, a SiNx layer (thickness: about 300 nm) is formed as the inorganic insulating layer by a CVD method. The organic insulating layer may be an organic insulating film (for example, an acrylic-based resin film) containing a photosensitive resin material.

Then the organic insulating layer is patterned. In this manner, openings through which part of the inorganic insulating layer is exposed are formed in the organic insulating layer at positions in the pixel regions Px. Then the inorganic insulating layer is patterned using the organic insulating layer as a mask. In this manner, the pixel contact holes CHp through which part of the drain electrodes DE of the TFTs 20 are exposed are formed in the upper insulating layer 13.

Step 8: Formation of Pixel Electrodes PE

Next, a first transparent conductive film (thickness: 20 to 300 nm) is formed on the upper insulating layer 13 and in the pixel contact holes CHp. The material of the first transparent conductive film may be a metal oxide such as indium-tin oxide (ITO), indium-zinc oxide, or ZnO. Then the first transparent conductive film is patterned. For example, an oxalic acid-based etching solution may be used to subject the first transparent conductive film to wet etching. In this manner, the pixel electrodes PE are formed in the respective pixel regions Px. In the pixel regions Px, the pixel electrodes PE are connected to the drain electrodes DE of the respective TFTs 20 within the respective pixel contact holes CHp.

Step 9: Formation of Dielectric Layer 17

Next, the dielectric layer 17 (thickness: 50 to 500 nm) is formed so as to cover the pixel electrodes PE. The material of the dielectric layer 17 may be the same as any of the materials exemplified as the material of the inorganic insulating layer of the upper insulating layer 13. In this example, a SiN film, for example, is formed as the dielectric layer 17 by a CVD method.

Step 10: Formation of Common Electrode CE

Next, the common electrode CE is formed on the dielectric layer 17.

First, a second transparent conductive film (thickness: 20 to 300 nm) is formed on the dielectric layer 17. The material of the second transparent conductive film may be the same as any of the materials (for example, ITO) exemplified as the material of the first transparent conductive film. Then the second transparent conductive film is patterned. The patterning may be wet etching using, for example, an oxalic acid-based etching solution. The common electrode CE is thereby obtained. The common electrode CE has one or a plurality of slits (openings) or cutout portions for each pixel region Px. The active matrix substrate 101 is thereby produced.

The method for producing the active matrix substrate in the present embodiment is not limited to the above method. It is sufficient that the pixel electrodes PE, the TFTs 20, and the source bus lines SL be arranged such that additional parasitic capacitances are formed, and any known production method can be used.

<Oxide Semiconductor>

The oxide semiconductor (referred to also as metal oxide or oxide material) contained in the oxide semiconductor layer in each TFT in the present embodiment may be an amorphous oxide semiconductor or may be a crystalline oxide semiconductor having a crystalline portion. Examples of the crystalline oxide semiconductor include polycrystalline oxide semiconductors, microcrystalline oxide semiconductors, and crystalline oxide semiconductors having a c-axis oriented substantially perpendicular to the layer surface.

The oxide semiconductor layer may have a layered structure including two or more layers. When the oxide semiconductor layer has a layered structure, the oxide semiconductor layer may include an amorphous oxide semiconductor layer and a crystalline oxide semiconductor layer. Alternatively, the oxide semiconductor layer may include a plurality of crystalline oxide semiconductor layers having different crystal structures. Alternatively, the oxide semiconductor layer may include a plurality of amorphous oxide semiconductor layers. When the oxide semiconductor layer has a two-layer structure including an upper layer and a lower layer, the energy gap of the oxide semiconductor contained in one of the two layers that is located on the gate electrode side (the lower layer in the bottom gate structure or the upper layer in the top gate structure) may be smaller than the energy gap of the oxide semiconductor contained in the layer opposite to the gate electrode (the upper layer in the bottom gate structure or the lower layer in the top gate structure). When the difference in the energy gap between these layers is relatively small, the energy gap of the oxide semiconductor in the layer on the gate electrode side may be larger than the energy gap of the oxide semiconductor located on the side opposite to the gate electrode.

The materials and structures of the amorphous oxide semiconductors and the crystalline oxide semiconductors, their deposition methods, the structure of the oxide semiconductor layer having a layered structure are described in, for example, Japanese Unexamined Patent Application Publication No. 2014-007399. The entire contents of the disclosure of Japanese Unexamined Patent Application Publication No. 2014-007399 are incorporated by reference for reference purposes.

The oxide semiconductor layer may contain, for example, at least one metal element selected from In, Ga, and Zn. In the present embodiment, the oxide semiconductor layer contains, for example, an In—Ga—Zn—O-based semiconductor (e.g., indium gallium zinc oxide). The In—Ga—Zn—O-based semiconductor is a ternary oxide of In (indium), Ga (gallium), and Zn (zinc). No particular limitation is imposed on the ratio (compositional ratio) of In, Ga, and Zn, and the compositional ratio may be, for example, In:Ga:Zn=2:2:1, In:Ga:Zn=1:1:1, or In:Ga:Zn=1:1:2. Such an oxide semiconductor layer may be formed from an oxide semiconductor film containing an In—Ga—Zn—O-based semiconductor.

The In—Ga—Zn—O-based semiconductor may be amorphous or crystalline. The crystalline In—Ga—Zn—O-based semiconductor may be a crystalline In—Ga—Zn—O-based semiconductor having a c-axis oriented substantially perpendicular to the layer surface.

The crystal structure of the crystalline In—Ga—Zn—O-based semiconductor is disclosed in Japanese Unexamined Patent Application Publication No. 2014-007399 described above, Japanese Unexamined Patent Application Publication No. 2012-134475, Japanese Unexamined Patent Application Publication No. 2014-209727, etc. The entire contents of the disclosures of Japanese Unexamined Patent Application Publication No. 2012-134475 and Japanese Unexamined Patent Application Publication No. 2014-209727 are incorporated by reference for reference purposes. TFTs including an In—Ga—Zn—O-based semiconductor layer have a high mobility (higher by a factor of 20 or more than that in a-Si TFTs) and a low leakage current (lower than 1/100 that in a-Si TFTs) and are therefore suitably used as driving TFTs (for example, TFTs that are included in a driving circuit disposed on a substrate having a display region including a plurality of pixels and are located in a portion around the display region) and pixel TFTs (TFTs disposed in pixels).

The oxide semiconductor layer may contain a different oxide semiconductor instead of the In—Ga—Zn—O-based semiconductor. For example, the oxide semiconductor layer may contain an In—Sn—Zn-O-based semiconductor (e.g., $In_2O_3$—$SnO_2$—ZnO: InSnZnO). The In—Sn—Zn—O-based semiconductor is a ternary oxide of In (indium), Sn (tin), and Zn (zinc). Alternatively, the oxide semiconductor layer may contain an In—Al-Zn-O-based semiconductor, an In—Al—Sn—Zn—O-based semiconductor, a Zn-O-based semiconductor, an In—Zn—O-based semiconductor, a Zn—Ti—O-based semiconductor, a Cd—Ge—O-based semiconductor, a Cd—Pb—O-based semiconductor, CdO (cadmium oxide), a Mg—Zn—O-based semiconductor, an In—Ga—Sn—O-based semiconductor, an In—Ga—O-based semiconductor, a Zr—In—Zn—O-based semiconductor, a Hf—In—Zn—O-based semiconductor, an Al—Ga—Zn—O-based semiconductor, a Ga—Zn—O-based semiconductor, an In—Ga—Zn—Sn—O-based semiconductor, an In—W—Zn—O-based semiconductor, etc.

The embodiments of the present disclosure are suitably applicable to active matrix substrates and more particularly to high-resolution active matrix substrates. Such active matrix substrates are applied to display devices such as liquid crystal display devices, organic electroluminescent (EL) display devices, and inorganic electroluminescent (EL) display devices, imaging devices such as image sensors, and various electronic devices such as image input devices, fingerprint readers, and semiconductor memories.

The present disclosure contains subject matter related to that disclosed in Japanese Priority Patent Application JP 2021-085393 filed in the Japan Patent Office on May 20, 2021, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An active matrix substrate comprising:
   a substrate having a plurality of pixel regions arranged in a row direction and a column direction in a matrix form;
   a plurality of gate bus lines supported on a principal surface of the substrate and extending in the row direction;
   a plurality of source bus lines supported on the principal surface of the substrate and extending in the column direction;
   a plurality of oxide semiconductor TFTs each disposed so as to be associated with a corresponding one of the plurality of pixel regions;
   a plurality of pixel electrodes each disposed in a corresponding one of the plurality of pixel regions; and
   an insulating layer,
   wherein the plurality of gate bus lines include a first gate bus line and a second gate bus line that are disposed adjacent to each other,
   wherein the plurality of source bus lines include a first source bus line and a second source bus line that are disposed adjacent to each other,
   wherein the plurality of pixel regions include a first pixel region defined by the first source bus line, the second source bus line, the first gate bus line, and the second gate bus line,
   wherein the plurality of pixel electrodes include a first pixel electrode disposed in the first pixel region,
   wherein the plurality of oxide semiconductor TFTs include a first oxide semiconductor TFT associated with the first pixel region,
   wherein the first oxide semiconductor TFT includes
   an oxide semiconductor layer including a channel region and a low-resistance region having a lower specific resistance than the channel region, the low-resistance region including a first region and a second region that are located on opposite sides of the channel region, the first region being electrically connected to the first source bus line, the second region being electrically connected to the first pixel electrode and a gate electrode electrically connected to the first gate bus line, wherein, when viewed in a direction normal to the substrate, the low-resistance region of the oxide semiconductor layer in the first oxide semiconductor TFT extends across the first source bus line to another pixel region of the plurality of pixel regions and partially overlaps another pixel electrode of the plurality of pixel electrodes that is disposed in the another pixel region with the insulating layer interposed between the low-resistance region and the another pixel electrode.

2. The active matrix substrate according to claim 1, wherein the plurality of pixel regions further include a second pixel region that is adjacent to the first pixel region with the first gate bus line interposed therebetween, and wherein, when viewed in the direction normal to the substrate, the low-resistance region of the oxide semiconductor layer in the first oxide semiconductor TFT extends across the first gate bus line and through the second pixel region to the another pixel region and partially overlaps a second pixel electrode of the plurality of pixel electrodes that is disposed in the second pixel region with the insulating layer interposed between the low-resistance region and the second pixel electrode.

3. The active matrix substrate according to claim 1, wherein the another pixel region is adjacent to the first pixel region in an oblique direction.

4. The active matrix substrate according to claim 1, wherein the another pixel region is adjacent to the first pixel region in the row direction.

5. The active matrix substrate according to claim 1, wherein the another pixel electrode is electrically connected to a source bus line of the plurality of source bus lines that is different from the first source bus line through an oxide semiconductor TFT of the plurality of oxide semiconductor TFTs that is associated with the another pixel region.

6. The active matrix substrate according to claim 1, wherein the another pixel electrode is electrically connected to the first source bus line through an oxide semiconductor TFT of the plurality of oxide semiconductor TFTs that is associated with the another pixel region.

7. The active matrix substrate according to claim 2, wherein the second pixel electrode is electrically connected to the first source bus line through a second oxide semiconductor TFT of the plurality of oxide semiconductor TFTs that is associated with the second pixel region.

8. The active matrix substrate according to claim 2, wherein the second pixel electrode is electrically connected to the second source bus line through a second oxide semiconductor TFT of the plurality of oxide semiconductor TFTs that is associated with the second pixel region.

9. The active matrix substrate according to claim 1, wherein the first pixel electrode has a portion that overlaps at least one of the first source bus line and the second source bus line with the insulating layer interposed therebetween.

10. The active matrix substrate according to claim 1, wherein, in the first oxide semiconductor TFT, the oxide semiconductor layer is located between the gate electrode and the substrate, and wherein the low-resistance region is a region of the oxide semiconductor layer that does not overlap the gate electrode or the first gate bus line when viewed in the direction normal to the substrate.

11. The active matrix substrate according to claim 1, further comprising: a dielectric layer; and a common electrode that is disposed so as to partially overlap the plurality of pixel electrodes with the dielectric layer interposed therebetween.

12. The active matrix substrate according to claim 11, wherein the plurality of pixel electrodes are located between the common electrode and the substrate.

13. The active matrix substrate according to claim 1, wherein the oxide semiconductor layer contains an In—Ga—Zn—O-based semiconductor.

14. The active matrix substrate according to claim 13, wherein the In—Ga—Zn—O-based semiconductor includes a crystalline portion.

15. A liquid crystal display device comprising:
the active matrix substrate according to claim 1;
a counter substrate disposed so as to be opposed to the active matrix substrate; and
a liquid crystal layer disposed between the active matrix substrate and the counter substrate.

16. An active matrix substrate comprising:
a substrate having a plurality of pixel regions;
an insulating layer;
a plurality of gate bus lines supported on a principal surface of the substrate; and
a plurality of source bus lines supported on the principal surface of the substrate, the plurality of source bus lines including a first source bus line and a second source bus line that are disposed adjacent to each other,
wherein each of the plurality of pixel regions includes a pixel electrode, an oxide semiconductor TFT electrically connected to the pixel electrode, a dielectric layer, and a common electrode that partially overlaps the pixel electrode with the dielectric layer interposed therebetween,
wherein the oxide semiconductor TFT of each pixel region includes
an oxide semiconductor layer including a channel region and a low-resistance region having a lower specific resistance than the channel region, the low-resistance region including a first region and a second region that are located on opposite sides of the channel region, the first region being electrically connected to one of the plurality of source bus lines, the second region being electrically connected to the pixel electrode of the each pixel region and
a gate electrode electrically connected to one of the plurality of gate bus lines,
wherein the plurality of pixel regions include a first pixel region, a second pixel region, and a third pixel region,
wherein the pixel electrode of the first pixel region and the pixel electrode of the second pixel region are electrically connected to the first source bus line through the respective oxide semiconductor TFTs,
wherein the pixel electrode of the third pixel region is electrically connected to the second source bus line different from the first source bus line through the oxide semiconductor TFT of the third pixel region, and
wherein the pixel electrode of the first pixel region includes a first portion that overlaps the low-resistance region of the oxide semiconductor TFT of the second pixel region with the insulating layer interposed therebetween and a second portion that overlaps the low-resistance region of the oxide semiconductor TFT of the third pixel region with the insulating layer interposed therebetween.

17. The active matrix substrate according to claim 16, wherein the oxide semiconductor layer contains an In—Ga—Zn—O-based semiconductor.

18. The active matrix substrate according to claim 17, wherein the In—Ga—Zn—O-based semiconductor includes a crystalline portion.

19. A liquid crystal display device comprising:
the active matrix substrate according to claim 16;
a counter substrate opposed to the active matrix substrate; and
a liquid crystal layer between the active matrix substrate and the counter substrate.

\* \* \* \* \*